United States Patent
Hooper

(10) Patent No.: US 11,173,571 B2
(45) Date of Patent: Nov. 16, 2021

(54) METHOD AND APPARATUS FOR CLADDING A SURFACE OF AN ARTICLE

(71) Applicant: LaserBond Limited, Cavan (AU)

(72) Inventor: Gregory Hooper, St Georges Basin (AU)

(73) Assignee: LaserBond Limited, Cavan (AU)

( * ) Notice: Subject to any disclaimer, the term of this patent is extended or adjusted under 35 U.S.C. 154(b) by 838 days.

(21) Appl. No.: 15/521,329

(22) PCT Filed: Oct. 26, 2015

(86) PCT No.: PCT/AU2015/050664
§ 371 (c)(1),
(2) Date: Apr. 24, 2017

(87) PCT Pub. No.: WO2016/061636
PCT Pub. Date: Apr. 28, 2016

(65) Prior Publication Data
US 2017/0312855 A1      Nov. 2, 2017

(30) Foreign Application Priority Data

Oct. 24, 2014   (AU) ................................. 2014904262
Oct. 24, 2014   (AU) ................................. 2014904263

(51) Int. Cl.
*B23K 26/34*      (2014.01)
*B05B 7/22*       (2006.01)
(Continued)

(52) U.S. Cl.
CPC .............. *B23K 26/34* (2013.01); *B05B 7/228* (2013.01); *B23K 26/083* (2013.01);
(Continued)

(58) Field of Classification Search
None
See application file for complete search history.

(56) References Cited

U.S. PATENT DOCUMENTS 6,122,564 A * 9/2000 Koch .................... B22F 3/1055
                                                       700/123
6,146,476 A   11/2000 Boyer
(Continued)

FOREIGN PATENT DOCUMENTS

CN      101235499      8/2008
CN      101529043      9/2009
(Continued)

OTHER PUBLICATIONS

International Preliminary Report on Patentability in International Application No. PCT/AU2015/050664, dated Oct. 19, 2016, 7 pages.
(Continued)

*Primary Examiner* — Geoffrey S Evans
(74) *Attorney, Agent, or Firm* — Fish & Richardson P.C.

(57) ABSTRACT

This invention relates to a method, system and apparatus for cladding a surface of an articles subject to corrosive, erosive or abrasive wear, such as impact or grinding tools. The method includes providing a supply of stock material and feeding the stock material towards a portion of the surface of the article via a dedicated feed source. A dedicated heat source heats the fed stock material and the portion of the surface of the article such that the heated stock material and the portion of the surface at least partially melt. Upon removal of the heat, the molten feedstock and the surface portion form a bonded coating layer on at least a portion of the surface of the article, thereby protecting that part of the assembly against wear.

14 Claims, 12 Drawing Sheets

Schematic representation of high speed laser functionally graded deposition layer with 85% overlap

(51) Int. Cl.
*E21B 4/14* (2006.01)
*C23C 14/54* (2006.01)
*C23C 24/10* (2006.01)
*C23C 14/58* (2006.01)
*C23C 28/04* (2006.01)
*C23C 14/28* (2006.01)
*C23C 28/00* (2006.01)
*B23K 26/342* (2014.01)
*B23K 26/144* (2014.01)
*B23K 26/08* (2014.01)

(52) U.S. Cl.
CPC .......... *B23K 26/144* (2015.10); *B23K 26/342* (2015.10); *C23C 14/28* (2013.01); *C23C 14/54* (2013.01); *C23C 14/5873* (2013.01); *C23C 24/103* (2013.01); *C23C 28/04* (2013.01); *C23C 28/324* (2013.01); *C23C 28/325* (2013.01); *E21B 4/14* (2013.01)

(56) References Cited

U.S. PATENT DOCUMENTS

| | | | |
|---|---|---|---|
| 6,269,540 B1 * | 8/2001 | Islam | B23K 26/0604 29/889.7 |
| 8,691,329 B2 | 4/2014 | Qi et al. | |
| 10,173,395 B2 * | 1/2019 | Muchtar | B23K 35/308 |
| 2004/0206550 A1 | 10/2004 | Gient | |
| 2006/0165546 A1 * | 7/2006 | Yamada | B33Y 30/00 419/6 |
| 2007/0261867 A1 * | 11/2007 | Techel | A01F 29/09 172/811 |
| 2008/0178994 A1 * | 7/2008 | Qi | F01D 5/02 156/245 |
| 2008/0226843 A1 * | 9/2008 | Fukubayashi | B23K 26/34 427/597 |
| 2009/0280269 A1 * | 11/2009 | Bewlay | B22F 5/04 427/596 |
| 2011/0072660 A1 * | 3/2011 | Flesch | B23K 9/048 29/888 |
| 2012/0118648 A1 | 5/2012 | Lorger | |
| 2014/0001161 A1 * | 1/2014 | Van Liden | B23K 26/34 219/76.14 |
| 2014/0072438 A1 * | 3/2014 | Bruck | B23K 26/082 416/223 R |
| 2014/0212636 A1 * | 7/2014 | Seals | B23K 35/325 428/198 |
| 2014/0272446 A1 | 9/2014 | Zheng et al. | |
| 2015/0298213 A1 * | 10/2015 | Beyer | B22F 5/10 419/7 |
| 2017/0028631 A1 * | 2/2017 | Hyatt | B05B 7/1468 |

FOREIGN PATENT DOCUMENTS

| | | | |
|---|---|---|---|
| CN | 102191495 | 9/2011 | |
| CN | 103484852 | 1/2014 | |
| CN | 103540928 | 1/2014 | |
| CN | 104870691 | 8/2015 | |
| GB | 2296731 | 7/1996 | |
| WO | WO-0185386 A2 * | 11/2001 | B29C 33/02 |
| WO | WO 2013/079803 | 6/2013 | |
| WO | 2014/0992111 | 6/2014 | |

OTHER PUBLICATIONS

CN Office Action Issued in Chinese Application No. 200810009273.7, dated Nov. 14, 2018, 72 pages.
PCT International Search Report and Written Opinion in PCT Appln. No. PCT/AU2015/050664, dated Dec. 16, 2015, 14 pages.

* cited by examiner

Schematic representation of laser clad layer with 50% overlap

Schematic representation of high speed laser deposition layer with 85% overlap.

Schematic representation of high speed laser functionally graded deposition layer with 85% overlap

METHOD AND APPARATUS FOR CLADDING A SURFACE OF AN ARTICLE

CROSS-REFERENCE TO RELATED APPLICATIONS

This application is a National Stage application under 35 U.S.C. § 371 of International Application No. PCT/AU2015/050664, having an International Filing Date of Oct. 26, 2016, which claims the benefit of Australian Serial No. 2014904263 filed Oct. 24, 2014 and Australian Serial No. 2014904262 filed Oct. 24, 2014. The entire disclosure of the prior application is considered part of (and is incorporated by reference in) the disclosure of this application.

TECHNICAL FIELD

The present invention relates generally to a method, system and apparatus for deposition of metallurgically bonded layers onto surfaces of metallic substrates, by laser deposition.

The invention in one form has been developed for use in connection with generally cylindrical components of the type used in down the hole ("DTH") hammer drills and will be described predominantly in this context. It should be appreciated, however, that the invention is not limited to this particular field of use, being potentially applicable to a wide range of applications where deposition of surface layers onto metal substrates is advantageous.

A common purpose for surface coatings is to tailor or improve wear resistance characteristics and the present invention will be described primarily with reference to such applications. Again, however, it should be appreciated that the invention may be utilised for application of surface layers and coatings for a broad range of functional, structural and aesthetic applications including but not limited to wear or abrasion resistance, thermal insulation, corrosion and chemical resistance, electrical conductivity or resistivity, medical or bio-medical compatibility, RFI/EMI shielding, surface colour, pattern or texture, dimensional restoration and cosmetic repair.

BACKGROUND OF THE INVENTION

The following discussion of the prior art is intended to frame the invention in an appropriate technical context and allow the associated advantages to be more fully understood. It should be appreciated, however, that any references to prior art should not be construed as an express or implied admission that such art, or any associated disadvantages or limitations, are widely known or part of common general knowledge in the field.

Several methods have hitherto been used for depositing wear resistant layers onto metal substrates, including thermal spraying, spray and fuse, and laser cladding techniques. Thermal spraying is utilised primarily for the application of high performance materials such as metals, alloys, polymers, ceramics and cermets onto more easily worked and less costly base materials. The technique essentially involves melting or thermally softening a stock source of the coating material by means of a heat source and accelerating particles of the heated coating material toward the substrate. Upon impact with the base material, a "splat" is formed, which moulds to irregularities in the surface of the pre-prepared base material, forming a mechanical type bond keyed to the surface of the substrate. A coating is produced by movement of the base material, the spraying apparatus or both until the required thickness and area of coating has been achieved. Typical deposit thicknesses range from 50 to 2000 microns, depending upon the materials and process utilised.

The quality of coatings produced using thermal spraying processes is influenced by a number of factors including the velocity of the molten particles upon impact, the temperature of the particles during their trajectory and upon impact, the morphology and composition of the material being applied, the chemical and thermal environment experienced by the particles during flight and upon impact with the base material, and the properties of the base material itself. Characteristics will also vary according to the particular thermal spraying technology utilised, examples of which include combustion wire spray, combustion powder spray, high velocity oxygen fuel, detonation gun, electric arc wire spray and electric arc plasma spray systems.

One advantage of thermal spray techniques over more traditional methods of surface coating and repair is that they are generally considered to be "cold" deposition processes, in the sense that the base material does not in most cases exceed temperatures of around 200° C. This allows the coating of substrates that would typically be considered uncoatable or unrepairable by welding and other high temperature processes. However, these techniques are subject to a number of inherent disadvantages including relatively low bond strengths, relatively high porosity and oxide levels with consequential vulnerability to corrosion, and in particular relatively high residual stresses within the coatings.

These residual stresses can greatly affect the threshold strain-to-fracture levels of the deposited coating, and therefore the load bearing capacity of the coating and the maximum thickness of the coating before the development of cracks and delamination. These limitations make this technique unsuitable for applications where high loads, impacts or severe corrosive conditions are likely to be encountered. To some extent these factors may be ameliorated by increasing particle velocities during the deposition process. However, the inherent problems arising from oxidation and the random nature of internal stresses within the applied coatings remain to a significant degree. The process is also relatively inefficient, with deposition efficiency often as low as 30%, and at best only around 70%.

Spray and fuse techniques typically achieve a wear resistant layer by first depositing a self-fluxing alloy, usually of Ni, Co or FE with additions of Si or B, via a thermal spray process of the type outlined above onto a suitably prepared base metal, and subsequently heating and fusing the deposit to the base metal, thereby to form a metallurgical bond. Typical deposit thicknesses range from 50 to 3000 microns. Because the melting point of self-fluxing alloys is substantially lower than that of the base metal being coated, during the fusing process there is no melting of the base metal required and a metallurgical bond is achieved by an inter-granular alloying/cohesion mechanism. Consequently, there is little or no dilution with the base material.

Before fusing can be accomplished, however, the heating of adjacent areas to relatively high temperature is required and this is usually accomplished with heating torches. Spray fusing in large-scale applications usually requires a post-fusing operation, involving highly experienced personnel clad in heat protective clothing and headgear. The process involves pre-heating the area previously coated to temperatures above 700° C. and then applying additional heat to temperatures above the melting temperature of the spray and fuse alloy, which is typically between 950° C. and 1250° C. depending on the particular alloy deposited, in order to melt and fuse the coating material, so that it wets and bonds to the metal substrate. Insufficient heat during this process will result in inferior bond strength, while excessive heat can cause the coating to become overly liquid and droop or run. After fusing, the cooling rate must usually be slowed, for example by means of an insulation medium, to minimise the risk of cracking. Considerable know-how and expertise are thus involved, and the process is relatively time-consuming and labour-intensive.

Although the self-fluxing alloys typically used are relatively resistant to oxidation and largely obviate the need for special atmospheres, the process is nevertheless subject to several inherent disadvantages. Firstly, it is fundamentally a two-step process, usually requiring the coating material to be first applied in a dedicated thermal spray booth, and the post-fusing process to be performed subsequently in a separately dedicated fusing area. The process is therefore time-consuming, expensive, requires extensive know-how, and on larger scale applications requires the involvement of multiple personnel. The success or failure of the process is highly operator-dependent. The extensive degree of heating required is energy intensive and creates a potentially hazardous working environment. Moreover, the temperatures reached during both pre-heating and fusing operations may adversely affect any heat treatment previously applied to the underlying component or substrate.

Laser cladding techniques utilise the energy of a laser beam to form a metallurgically bonded layer on the metal base. Lasers that may be used for this purpose include $CO_2$, Nd:YAG, Nd:YVO$_4$, Diode, Disc and Fibre lasers.

This system provides a number of advantages over other techniques including highly variable energy adjustment, strong metallurgical bonds, lower dilution with the base metal, smaller heat affected zones, lower deleterious heat affects to the base material and deposited layer, minimal distortion, and high heating and cooling rates resulting in relatively fine microstructures and metastable phases.

One form of this technique that is particularly advantageous in applications requiring abrasive and erosive wear resistance, is the simultaneous cladding of a matrix alloy and hard-phase particles to produce a composite microstructure in which the hard-phase particles retain their integrity in a ductile matrix. This structure is generally referred to as a metal matrix composite ("MMC"). In abrasive and erosive environments, the ductile matrix material is first worn away, until there is insufficient matrix material encapsulating the hard phase particles, at which point the hard phase particles are removed. It is therefore areas within a deposited MMC layer with an unevenly low percentage distribution of hard phase particles that will have a higher rate of wear and will ultimately limit overall performance. Such areas constitute the "weak link in the chain" of surface coatings of this type.

Consequently, the full potential benefits of laser cladding techniques are often not realised in practice, and reflected in real-world performance.

One form of the invention has been found to be particularly well adapted for use in connection with down the hole (DTH) hammer drills. As will be well known to those skilled in the art, such drills attach to the lower end of a drill string, to induce a pneumatic hammering action analogous to that of a jackhammer. This rapid percussive action in conjunction with rotation and downward pressure applied to the drilling assembly breaks hard rock into small fragments, flakes and dust, which are blown clear of the drill bit by air exhausted from the DTH hammer mechanism. Such mechanisms greatly accelerate drilling through hard rock, even when used in connection with relatively small and portable drillcat type drilling rigs.

While highly effective for rock drilling, however, DTH hammer drills have been found to be subject to relatively rapid and often premature erosive wear, particularly at certain locations including the leading edges of the top sub-assembly, casing and drive chuck, and the skirt diameter of drill bits. Rapid wear has also been found to occur in areas of the casing subjected to the clamping action of the drilling machine that enables twisting movement of the casing and top sub-assembly or drive chuck in opposite directions, to perform loosening or tightening of the top-sub or drive chuck with respect to the casing. Once wear becomes excessive, the DTH hammer drilling assembly must be withdrawn and either replaced or reconditioned. This in itself is a time-consuming and costly process. However, it is also a major disruption to the drilling operation. Therefore, even modest reductions in wear rates can be highly commercially significant in this context.

It is an object of the invention to overcome or substantially ameliorate one or more of the disadvantages or limitations of the prior art, or at least to provide a useful alternative.

SUMMARY OF THE INVENTION

Accordingly, in a first aspect, the invention provides a method of cladding a surface of an article, the method including the steps of:

providing a supply of stock material;

feeding the stock material towards a portion of the surface of the article via a dedicated feed source; and heating the portion of the surface of the article via a dedicated heat source such that the fed stock material and the portion of the surface at least partially melt, whereby, upon removal of the heat, the molten feedstock and the surface portion form a bonded coating layer deposited by way of overlapping beads on the surface of the article, wherein each deposited bead is overlapped with the previously deposited bead to an extent of greater than 50% of the respective bead width.

As described in further detail below, the step of feeding the stock material to the surface of the article is preferably achieved through the use of a dedicated feeding system or mechanism, referred to herein as the feed source. Similarly, the step of heating the stock material and surface of the article is preferably undertaken with the use of a dedicated heating system or mechanism, referred to herein as the heat source.

Preferably, the article is arranged so as to be movable relative to the feed and heat sources. In some embodiments, the article is releasably mounted to a workstation (e.g. worktable), wherein the workstation is selectively movable relative to the feed and heat sources. In other embodiments, the feed and heat sources are selectively movable relative to the workstation/article. In certain embodiments, the feed and heat sources and the workstation/article are selectively and independently movable to provide the desired position, orientation and spacing between the respective components.

In some embodiments, the workstation is configured to enable linear motion of the workstation, thereby to effect a corresponding movement of the article mounted thereto. For example, the workstation may be adapted for movement along each of the Cartesian coordinate axes (i.e. x-, y-, z-axes). In other embodiments, the article may be rotatably mounted to the workstation, enabling the article to rotate about one or more axes. In such embodiments, the workstation may also be adapted for movement along each of a set of Cartesian coordinate axes (i.e. x-, y-, z-axes), or for linear movement within a plane (e.g. x-y plane), thereby facilitating movement (and positioning) of the article relative to the feed and heat source.

In some embodiments, the article is mounted to the workstation in a substantially horizontal orientation (i.e. such that the longitudinal axis of the article extends along a substantially horizontal plane). In other embodiments, the article is mounted to the workstation in a substantially vertical orientation (i.e. such that the longitudinal axis of the article extends along a substantially vertical plane). In some embodiments, the article is mounted to the workstation such that the longitudinal axis of the article is inclined relative to the axis of the workstation (e.g. relative to a horizontal or vertical plane).

Preferably, a control means is operatively associated, and in communication, with the workstation for controlling movement of the workstation. The control means may include a computer numerically controlled (CNC) unit, enabling the movement of the workstation to be programmed to run automatically along a desired path. In some embodiments, the control means may also be operatively configured for controlling movement of the feed and heat sources relative to the article and/or workstation.

In some embodiments, the article is formed of a metal, ceramic, or polymer. In some embodiments, the surface of the article on which the bonded coating layer is formed is a substantially flat surface or an uneven surface (with regular or irregular surface profile). In other embodiments, the surface of the article on which the bonded coating layer is formed is a curved surface (e.g. a convex surface or a concave surface). The surface may be an inner surface or an outer surface of the article.

In preferred embodiments, the article is a tool, or part of a tool. In one particularly preferred embodiment, the article is a pneumatically actuated down the hole ("DTH") hammer drill.

In some embodiments, the step of heating the stock material includes the use of at least one heat source. The, or each, heat source is preferably in the form of a laser. In certain embodiments, the heat source may be adapted to heat the fed stock material during transit from the point at which it leaves or exits an output of the feed mechanism until the fed stock reaches the surface of the article (i.e. along the trajectory path of the stock material), and optionally for a predetermined period after the fed stock comes into contact with the surface of the article.

In some embodiments, the laser is selected from the group, including but not limited to, $CO_2$ lasers, Nd:YAG lasers, Nd:YVO$_4$ lasers, diode pumped Nd:YAG lasers, diode lasers, disc lasers, and fibre lasers.

Preferably, the laser has a predetermined power output. The laser preferably has an adjustment means for selectively adjusting, controlling and setting the power output of the laser.

In certain preferred embodiments, the laser has a power output within the range of approximately 3 kW to 20 kW. In one particularly preferred embodiment, the laser has a power output within the range of approximately 4 kW to 10 kW. It will of course be appreciated by those skilled in the relevant art that the invention is not limited to applications with a laser having the above listed power parameters, but rather may be selected so as to have the necessary power requirements for a particular cladding application.

Preferably, the laser is selectively configurable to produce an output power or energy which limits the extent to which the surface of the article is melted by the laser, to a predetermined maximum depth.

Preferably, the heat source (laser) is adapted to provide a laser beam with a predetermined energy for simultaneously heating and melting a portion of the metal surface of the article and separately delivered feedstock (powder or wire stock) to form a melt pool. The laser preferably melts the surface of the article to an approximately predetermined depth, thereby forming a molten bonding zone on the surface of the article. The feedstock preferably has desired chemical properties such that the molten feedstock and bonding zone, within the melt pool, coalesce to form a metallurgically bonded wear resistant layer on the surface of the metal base.

In other variations and preferred embodiments, the feed source can be adapted to feed the feedstock material from a position located behind the laser beam whereby the feedstock is fed directly into the molten pool generated by the laser beam and does not pass through the laser beam as it travels towards the surface. It has been observed that such embodiments can provide advantages in terms of providing an uninterrupted laser beam to the surface of the article, whereby the full effect or energy of the laser beam reaches and is absorbed by the surface and thus improving the efficiency at which the surface is heated.

Advantageously, in preferred embodiments, the laser heat source is configured to melt the surface of the article to a predetermined depth so as to minimise dilution of the feedstock, thereby substantially maintaining the initial material properties of the feedstock upon formation of the wear resistant coating layer. The material properties of the feedstock include, for example, its composition and hardness. In this context, geometric dilution is defined as the ratio of the clad depth in the substrate over the total clad height. In some embodiments, dilution rates of less than 5% can be advantageously achieved with the laser cladding process described herein, subject to suitably accurate control of the laser parameters within a narrow processing range. However, dilution rates within a range of approximately 5% and 10% are more typical.

In some embodiments, an optical focusing mechanism, such as a lens or a set of two or more lenses, is operatively associated with the laser for directing and focusing the laser beam onto the desired area or portion of the surface of the article. In certain embodiments, the laser has a minimum beam spot diameter in the range of approximately 2 mm to 20 mm.

In some embodiments, the feed source comprises a feed mechanism including a feed nozzle, the feed nozzle being operatively associated with a reservoir of the stock material, for example via a feed-line, conduit or hose.

In some embodiments, the feed nozzle is adapted to direct the feedstock material along an axis or plane which extends in a direction orthogonal, inclined or parallel relative to the surface of the article (e.g. the feed nozzle may feed the stock material along an axis within the range of 0 to 90 degrees, relative to the surface of the article). In certain preferred embodiments, the feed nozzle is a coaxial nozzle adapted to direct the feedstock material along an axis substantially coaxially aligned with the axis of the laser beam. In other preferred embodiments, the feed nozzle is a lateral nozzle adapted to feed the feedstock material from a position adjacent to the laser beam. In certain preferred embodiments, the relative angle of incidence of the stock material fed from the feed nozzle may be constant or may vary. The angle of attack may also vary from one pass of the feed mechanism across the surface of the article to the next pass.

In some embodiments, the feed mechanism is selectively movable relative to the surface of the base material. In certain embodiments, the feed mechanism is adapted for selective movement along a set of Cartesian coordinate axes (e.g. X-, Y-, and/or Z-axis movements). Preferably, the feed mechanism is in communication with a controller for selectively controlling and adjusting the position of the nozzle head relative to the surface of the article.

In some embodiments, the feed mechanism/nozzle is adapted for gravity feeding the stock material towards the surface of the article (e.g. via a hopper). In other embodiments, the feed mechanism/nozzle is adapted for pressurised feeding of the stock material towards the surface of the article. Preferably, such pressure fed systems are used in conjunction with particulate stock material which is entrained and directed towards the surface of the article, via the feed nozzle within a stream of gas.

In some embodiments, the feed mechanism is adapted to enable the deposition of functionally graded layers in a single pass or step across the surface of the article. In some embodiments, the feed mechanism has at least two feed nozzles for depositing a double graded coating layer in a single pass. In some embodiments, the two or more feed nozzles may be structurally separate nozzle devices. In other embodiments, the two or more feed nozzles may be part of an integrated single head, dual or multi-nozzle unit.

In some embodiments, the feed mechanism comprises a first feed nozzle adapted to deposit a first feedstock material, and a second feed nozzle adapted to deposit a second feedstock material. Preferably, the first nozzle is adapted to deposit the first feedstock material directly onto the surface of the article to form a primary sub-layer of the coating, and the second nozzle is adapted to deposit the second feedstock material onto the first sub-layer to form a secondary sub-layer of the coating.

In some embodiments, the first feedstock material is contained in a first reservoir or container, the first feed nozzle being in communication with, and operatively associated with, the first reservoir such that the first feedstock material can be fed through the first feed nozzle. In some embodiments, the second feedstock material is contained in a second reservoir or container, the second feed nozzle being in communication with, and operatively associated with, the second reservoir such that the second feedstock material can be fed through the second feed nozzle. In other embodiments, the first and second nozzles are both in communication with a single reservoir of feedstock material, whereby the same stock material is used for both the primary and secondary sub-layers.

By incorporating more than one feed nozzle and delivering different feedstock materials to the melt pool, via the respective nozzles, the deposited coating structures can be advantageously tailored to suit the requirements for particular applications (e.g. desired wear resistance properties). In certain embodiments, the thickness of each of the sub-layers of the coating may be controlled by the respective feed rate of the associated nozzle, and may be same thickness as each other, or vary with respect to the thickness of the other sub-layer.

To achieve coverage of the coating layer across a desired area of the surface of the article, the deposited beads are overlapped with the previously deposited bead. In some embodiments, the deposited beads are overlapped to an extent within the range of approximately 40% to 95% of the bead width. In some preferred embodiments, the pitch/overlap is within the range of approximately 40% to 60% of the bead width, with the desired thickness/height of the layer achieved with each bead. It has been found that a specific energy of approximately 22 joules/mm$^2$ is required to produce a well bonded layer. It has also been found that a decreased pitch/increased bead overlap within the range of 75% to 95% provides particular advantages in terms of improvements to cladding properties (including improved wear resistance) of the coating layer.

In some embodiments, the heat source (laser), together with the component movement device (e.g. worktable), is configured such that a bead or track of coating is deposited or applied to the surface at a predetermined travel speed, being the speed or rate at which the laser (and thus melt pool) travels with respect to the surface of the article; that is, the speed of movement of the laser beam along or over the surface of the article. In certain embodiments, the travel speed for laser cladding deposits is determined with reference to the power output of the laser. For example, for a high powered laser with a power output in the range of 4 kW to 10 kW, travel speeds are usually set to within the range of 500 mm/min to 2,000 mm/min. This speed range is typical so as to allow for sufficient base material and feed material melting and coalescing to form a strong metallurgically bonded layer. Surprisingly and advantageously, however, it has been found that improved cladding properties (including improved wear resistance) can be achieved by increasing the travel speed and simultaneously decreasing pitch/increasing bead overlap to within the range of 75% to 95%. It has been found that an increased travel speed within the range of 4,000 mm/min to 40,000 mm/min provides particular advantages in terms of improvements to cladding properties (including improved wear resistance) of the coating layer.

In some embodiments, the functionally graded laser deposition layer may have a bead overlap greater than 50%. In some preferred embodiments, the functionally graded laser deposition layer may have a bead overlap within the range of approximately 50% to 95%. In one particularly preferred embodiment, provided by way of example only, the functionally graded laser deposition layer has a bead overlap of approximately 85%.

It will be appreciated by those skilled in the relevant art that the stock material may be selected based on predetermined chemical properties to facilitate coalescing, fusing, mixing and/or bonding with the base material of the article. In some embodiments, the feedstock material is a powdered material. In some embodiments, the feedstock material is a wire material. Preferably, the feedstock material is metallic. In preferred embodiments in which the article and the stock material are both formed of metal, the laser cladding process advantageously forms a strong metallurgically bonded wear resistant coating layer on the surface of the article.

In certain embodiments, the stock material is in the form of a metal matrix composite (MMC). A stock material formed of MMC is particularly advantageous due to its characteristics of potentially high abrasive and erosive wear resistance.

In some embodiments, the composition of the MMC includes a matrix material and a hardening or reinforcing material dispersed within the matrix material.

In some embodiments, the matrix material is a metal. Preferably, the matrix material is a wear resistant material. In certain embodiments, the matrix material is a particulate, granular, or powdered material. In some embodiments, the matrix material is formed of particles having a size within the range of approximately 15 μm to 200 μm. In certain embodiments, the matrix material is formed of a self fluxing alloy. For example, the wear resistant matrix material may be selected from the group, including but not limited to, nickel, cobalt and iron. In some embodiments, the self fluxing alloy may contain additions of boron or silicon, or the like or combinations thereof.

In some embodiments, the reinforcing material is a particulate, granular, powdered, or fibrous material. In certain preferred embodiments, the reinforcing material is selected from the group including, but not limited to, tungsten carbide, titanium carbide, chromium carbide, niobium carbide, silicon carbide, vanadium carbide and boron carbide. In some embodiments, the reinforcing material is formed of particles having a size within the range of approximately 1 µm to 350 µm, more preferably approximately 5 µm to 200 µm.

In some embodiments, the MMC comprises approximately 5 to 90 percent by weight of matrix material (i.e. binder phase), and from 10 to 95 percent by weight of reinforcing material (i.e. hard phase particles).

In preferred embodiments, the MMC advantageously enables the simultaneous cladding of a matrix alloy and hard-phase particles, yielding a composite microstructure in which the hard-phase particles retain their integrity in a surrounding ductile matrix. In one preferred embodiment, the metal matrix composite (MMC) layer is formed of tungsten carbide, in a nickel based self fluxing alloy matrix, and is deposited with a laser heat source.

In certain embodiments, a nickel or cobalt based self fluxing alloy is preferred for the matrix material, due to their lower melting temperatures and associated lower reactive influence on the carbide particles, as well as excellent wetting characteristics with the carbide particles and the base metal.

In preferred embodiments, tungsten carbide is preferred for the hard phase particles due to its high hardness, high melting point, and low coefficient of thermal expansion. Tungsten carbide is also advantageous as it exhibits good wettability with molten metals. One drawback of tungsten carbide relates to the fact that it has a low heat of formation, making it easily dissolved by molten metals. It is therefore important that the tungsten carbide be subjected to the minimum degree of heat energy possible. Preferred embodiments of the present invention advantageously enable the use of a heat source adapted such that the pre-deposited layer and base material are subjected to a lower specific heat energy through the use of higher heat source travel speeds across the surface of the article.

In some embodiments, the hard phase particles and the matrix alloy can be blended together to form a composition with desired weight percentages before being delivered to the feed/cladding nozzle of the feed mechanism. In other embodiments, the hard phase particles and the matrix alloy can be delivered to the feed/cladding nozzle separately.

It has been found that, in certain preferred embodiments, feeding the hard phase particles and the matrix alloy separately can advantageously produce an MMC deposit with a substantially even distribution of hard phase particles across the entire coating layer. This substantially even distribution of hard phase particles within a deposited MMC layer provides significant advantages in terms of improved ability to withstand abrasive and/or erosive wear conditions. It has been observed that, in MMC coating layers, the ductile matrix material is worn away first. Once there is insufficient matrix encapsulating the hard phase particles, these particles are subsequently removed. In particular, it has been observed that those areas within an MMC deposited layer having an unevenly lower percentage of hard phase particles will have a higher rate of wear compared to those areas having a relatively higher percentage or concentration of hard phase particles. Thus, the preferred embodiments of the present invention enabling laser clad wear resistance coating layers to be formed with a substantially even distribution of hard phase particles within the entire coating provide a significant advantage to the functionality of the coating layer described herein.

In some embodiments, in an effort to provide an even distribution of hard phase particles within a laser clad MMC layer, the heat source (laser), in combination with the feed source, is adapted to provide a substantially continuous, steady, even flow of stock material to the melt pool. Preferably, control and/or sensing means are provided to continuously monitor and, if necessary, adjust the input parameters to either or both of the heat and feed sources such that the desired continuous, steady, even flow of stock material is achieved and maintained over the coating cycle. In some preferred embodiments, the increased travel speed coupled, with an increased bead overlap, necessitates that a number of passes be performed before the desired thickness is achieved. In this way, the melt pool area is advantageously reduced, with a consequential reduction in the melt pool size and the extent of melt pool stirring—further contributing to the formation of a coating layer with an even distribution of particles throughout.

Further advantages arising from preferred embodiments include the ability to produce MMC layers, deposited via laser cladding, with beneficial properties, including but not limited to: reduction of total (laser) heat input, smaller mean carbide particle sizes, higher percentage of entrained carbide, lower decarburisation, and dissolution of the carbide, lower dilution with base material, and smaller heat affected zones.

In one preferred embodiment, the MMC layer may contain, for example, 68 w % WC, and 32 w % NiBSi alloy. It has been observed in trials that a MMC having these exemplary properties, when used in combination with suitable laser cladding parameters, produces coating layers having dramatically improved properties and characteristics in terms of improved wear performance.

In some embodiments, the coating layer has a thickness which is proportional to the size of the article to which it is applied. For example, the thickness of the coating layer may be proportional to the thickness of the article, or to the inside or outside diameter of the article. In certain embodiments, the coating layer is applied so as to have a thickness in the range of approximately 0.1 mm to 3 mm. In other embodiments, the coating layer is applied so as to have a thickness in the range of approximately 5 to 100 percent of the outside diameter of a generally cylindrical article. In some embodiments, the coating layer is applied so as to provide area coverage in the range of approximately 5 to 100 percent of the surface area of the article being clad.

In a further aspect, the invention provides a down the hole ("DTH") hammer drill assembly, including:

a casing, a top sub releasably engagable with an operative upper end of the casing;

a front (or drive) chuck releasably engagable with an operative lower end of the casing; and a drill bit releasably engagable with an operative lower end of the front (or drive) chuck;

wherein, at least one of the casing, top sub, front chuck, and drill bit (collectively the "parts" of the assembly) is configured so that a respective leading edge of the respective part has a smaller diameter than that of the adjacent part of the assembly, thereby protecting the leading edge of that part of the assembly against wear.

As is described in further detail below, the parts of the DTH hammer drill assembly are at least partially coated with a protective MMC coating layer. It has been found unexpectedly that a smaller diameter on a leading edge of a part of the assembly, relative to the mating surface of the adjacent part, advantageously protects the coating layer on the leading edge, giving rise in turn to significant commercial benefits arising from an extended working life of the drill assembly, with associated increases in efficiency of production processes (e.g. less down time for maintenance and repair) and related labour and capital cost savings.

In a further aspect, the invention provides a down the hole ("DTH") hammer drill assembly, including:

a casing, a top sub releasably engagable with an operative upper end of the casing;

a front (or drive) chuck releasably engagable with an operative lower end of the casing; and a drill bit releasably engagable with an operative lower end of the front (or drive) chuck;

wherein, at least one of the casing, top sub, front chuck, and drill bit (collectively the "parts" of the assembly) is at least partially coated with a protective coating layer, thereby protecting that part of the assembly against wear.

In some embodiments, at least one surface of each pair of adjacent face-to-face mating surfaces of the respective parts of the drill assembly is coated with a protective coating layer. Preferably, each mating surface of the respective parts of the drill assembly is coated with a protective coating layer. In certain embodiments, a protective coating layer is provided on one or more surfaces of the respective parts of the assembly adjacent the mating surface.

In some preferred embodiments, a lower mating surface of one part of the assembly has a smaller outer profile or diameter compared to an outer profile or diameter of an upper mating surface of the adjacent part of the assembly, wherein in use the smaller lower mating surface is in face-to-face abutment with the larger upper mating surface. In one preferred embodiment, there is provided three such pairs of mating surfaces in which the lower mating surface of one part has a smaller outer diameter relative to that of the upper mating surface of the adjacent part, wherein: a first pair of mating surfaces is provided between the top sub and the casing, a second pair of mating surfaces is provided between the casing and the front or drive chuck, and a third pair of mating surfaces is provided between the front or drive chuck and the drill bit. In other embodiments, a lower mating surface of one part of the assembly has a larger outer profile or diameter compared to that of an upper mating surface of the adjacent part of the assembly, wherein in use the larger lower mating surface is in face-to-face abutment with the smaller upper mating surface.

In a further aspect, the invention provides a down the hole ("DTH") hammer drill assembly, including:

a casing having an upper opening defining an upper mating surface, and a lower opening defining a lower mating surface;

a top sub having a spigot adapted to be releasably received in the casing via the upper opening, and a boss having a leading end adapted to abut the upper mating surface, thereby limiting the extent to which the spigot is received in the casing;

wherein, the size of the upper mating surface of the casing is different relative to the size of the leading end of the boss.

In some embodiments, the casing is cylindrical and the upper and lower mating surfaces are circular. Preferably, each of the upper and lower mating surfaces is in the form of an annulus, having an inner diameter and an outer diameter. In some embodiments, the casing has a substantially constant cross-sectional profile such that the inner and outer diameters of the upper mating surface are the same size as the inner and outer diameters of the lower mating surface. In certain preferred embodiments, a lower or leading end of the casing is profiled (e.g. bevelled or chamfered) such that the inner and outer diameters of the lower mating surface are smaller relative to the inner and outer diameters of the upper mating surface.

In some embodiments, the spigot is cylindrical having an outer diameter sized to pass through the inner diameter of the upper mating surface.

In some embodiments, the boss is substantially cylindrical in shape. In certain embodiments, the leading end of the boss is profiled such that it has a smaller outer diameter relative to the outer diameter of the upper mating surface. The profiled leading end of the boss is preferably smaller than a main body portion of the boss. In certain embodiments, the boss is profiled by way of a bevel, chamfer or the like formed on its operative lower end, the bevel or chamfer forming the leading end of the boss. Preferably, the size of the upper mating surface of the casing is greater than the size of the leading end of the boss.

In some embodiments, the DTH hammer drill assembly has a front (or drive) chuck having a spigot adapted to be releasably received in the casing via the lower opening, and a boss adapted to abut the lower mating surface, thereby limiting the extent to which the spigot is received in the casing;

wherein, the size of the lower mating surface of the casing is different relative to the size of the leading end of the boss.

Preferably, the size of the lower mating surface of the casing is smaller relative to the size the respective mating surface of the drive chuck boss. The difference in size between the lower mating surface and the respective mating surface of the drive chuck boss is preferably provided by the profile (e.g. bevel) at the lower end of the casing.

In certain preferred embodiments, the drive chuck boss has a tapered outer surface profiled such that its operative lower end is smaller than its operative upper end. In other embodiments, the drive chuck boss is generally cylindrical with a bevel formed at its operative lower end.

In some embodiments, the DTH hammer drill assembly has a drill bit incorporating a spigot or spindle adapted to be releasably received in the drive chuck (via a lower opening in the drive chuck), and a drill boss adapted to abut a lower mating surface of the drive chuck boss, thereby limiting the extent to which the drill bit is received in the drive chuck;

wherein, the size of the lower mating surface of the drive chuck is different relative to the size of an operative upper mating surface of the drill boss.

Preferably, the size of the lower mating surface of the drive chuck is smaller relative to the size the respective mating surface of the drill boss. The difference in size between the lower mating surface and the respective mating surface of the drill boss is preferably provided by the tapered outer surface profile of the drive chuck boss (or bevel at the lower end of the drive chuck boss).

Preferably, at least a portion of one of the top sub, the casing, the front chuck, and the drill has a coating deposited thereon. A coating is preferably applied to each of the top sub boss, the casing, the drive chuck boss, and the drill bit boss, including on the respective bevelled ends.

Preferably, the coating is a protective coating such as a wear resistant coating for resisting erosive and abrasive wear. The coating is preferably applied to the respective portion or portions of the DTH hammer drill by the cladding method described herein and in accordance with the principles and parameters of the present invention.

To protect the leading edges of the laser deposited MMC, the individual parts of the DTH Hammer drill (namely the top sub, the casing and the drive chuck) are preferably pre-machined before the cladding process so that the respective leading edges have a smaller diameter than the adjacent mating diameter and bevelled back at an angle to the original starting diameter.

In some embodiments, the bevel is configured so as to extend at an angle within the range of approximately 1 degree to 75 degrees, relative to the longitudinal axis of the respective part. In some embodiments, the leading edge diameter of the individual parts of the DTH hammer drill is smaller than the adjacent mating part diameter by an amount within the range of between 0.1 mm and 10 mm.

For example, the leading edge diameter of a drive chuck may be pre-machined to incorporate a bevel which is smaller than the adjacent skirt diameter of the drill bit by approximately 2 mm, and which extends at an angle of approximately 45 degrees. Similarly, the leading edge diameter of the casing may be pre-machined so as to be smaller than the adjacent mating drive chuck diameter by, for example, approximately 2 mm, bevelled back to the original start diameter at an angle of approximately 45 degrees. As a further example, the leading edge diameter of the top sub may be pre-machined so as to be smaller than the adjacent mating casing diameter by approximately 2 mm, and bevelled back to the original start diameter at an angle of approximately 45 degrees.

In a further aspect, the invention provides a down the hole ("DTH") hammer drill having at least one portion with a coating deposited thereon by the cladding method described herein and in accordance with the principles and parameters of the present invention.

In one particularly preferred embodiment, the coating layer is applied as a wear resistant protective layer to a pneumatically actuated down the hole ("DTH") hammer drill. Preferably, the coating is selectively applied to the DTH hammer drill at discrete positions on or along the drill, or on selected parts or areas of the drill assembly.

In some embodiments, the coating may be applied uniformly to each of those parts or positions of the drill to which the coating is applied. In other embodiments, the coating may be applied with greater thickness on certain parts of the drill relative to the thickness of the coating applied to other parts of the drill (e.g. the thickness of the coating at a particular position, or on a particular part of the drill, may be determined by the extent of erosive or abrasive movement or conditions to which that part of the drill will be subjected during its working life. That is, a greater coating thickness may be employed on those areas of the drill assembly which are expected to be subjected to harsher working conditions). In some preferred embodiments, the wear resistant protective coating layer may be applied in bands or tracks. Preferably, the bands or tracks extend in a generally continuous uninterrupted manner around the drill, within the area to which the coating is applied. The bands or tracks are preferably deposited so as to extend along a circumferentially overlapping, spirally directed path, wherein successive passes (or beads) of the band overlap the previous (or immediately adjacent) band.

In some embodiments, the wear resistant protective coating is applied to at least one or more of an outside surface of a driver sub-assembly (front chuck), a top sub-assembly (hammer coupler), a casing, and a drill bit of a pneumatically actuated DTH hammer drill.

Preferably, the casing of the DTH drill comprises at least one zone of auxiliary coating for enhancing the wear resistance of the casing within a predetermined section of the casing. In some embodiments, the casing has two zones of auxiliary coating to enhance wear resistance in two corresponding sections of the casing. In preferred embodiments, the one or more zones of auxiliary coating correspond with locations engageable by a clamp of an associated machine in which the DTH drill is used, thereby enhancing the ability of the casing to withstand wear arising from contact sliding and/or twisting movement of the casing with the clamp.

In some embodiments, the or each zone of auxiliary coating comprises one or more bands of coating, the bands being spaced apart by a predetermined distance. In some embodiments, each band is substantially the same width. In other embodiments, the widths of the bands may vary with respect to one another. In some embodiments, the spacing between the bands may be equal to, greater than, or less than the band width.

In some embodiments, the or each zone of auxiliary coating comprises three bands, with two intermediate spacing regions. In some embodiments, the casing comprises a first zone of auxiliary coating at or adjacent an upper end of the casing and a second zone of auxiliary coating at or adjacent a lower end of the casing, wherein the first zone is positioned so as to substantially correspond in location to an upper clamp area of the ancillary machine (e.g. a machine for loosening and tightening the hammer drill assembly with respect to the drill string or the drill bit with respect to the hammer drill), and the second zone is positioned so as to substantially correspond in location to a lower clamp area of the ancillary drilling machine.

Preferably, the bands are configured to extend circumferentially around the casing. In other forms, the bands may additionally or alternatively extend longitudinally along the casing.

In some embodiments, the top sub has a spigot adapted to be releasably received in the casing via the upper end, and a boss defining a leading end mating surface adapted to abut the upper mating surface of the casing, thereby limiting the extent to which the spigot is received in the casing; wherein, the protective coating is applied to an exterior surface of the boss. Preferably, an operatively lower end of the boss of the top sub has a bevelled profile such that a lower mating surface of the boss has a smaller diameter than a diameter of an upper mating surface of the casing.

In some embodiments, an operatively lower end of the casing has a bevelled profile such that a lower mating surface of the casing has a smaller diameter relative to a diameter of an upper mating surface of the drive chuck.

In some embodiments, the drive chuck has a spigot adapted to be releasably received in the casing via the lower end, and a boss defining a leading end mating surface adapted to abut an upper mating surface of the drill bit; wherein, the protective coating is applied to an exterior surface of the boss.

Preferably, the boss of the drive chuck has a tapered outer surface profile such that its leading end mating surface is smaller than an upper mating surface of the drill bit.

In some embodiments, the drill bit has a spindle adapted to be releasably received in a lower opening in the drive chuck, and a drill boss defining the upper mating surface of the drill bit and adapted to abut the lower mating surface of the boss of the drive chuck; wherein, the protective coating is applied to an exterior surface of the boss.

In a further aspect, the invention provides an apparatus/system for cladding a surface of an article, the apparatus/system including:

a feed mechanism associated with a supply of stock material, the feed mechanism being configured for feeding the stock material towards a portion of the surface of the article; and a heat source for heating the portion of the surface of the article such that the fed stock material and the portion of the surface at least partially melt, whereby, upon removal of the heat, the molten feedstock and the surface portion cooperate to form overlapping beads to define a bonded coating layer on the surface of the article, wherein each bead of the coating layer is overlapped with the previously deposited bead to an extent greater than 50% of the respective bead width.

In some embodiments, the heat source is adapted to simultaneously heat the fed stock material and the portion of the surface of the article such that the heated stock material and the portion of the surface at least partially melt, enabling the formation of the bead upon removal of the heat. In other embodiments, the heat source is adapted to heat only the portion of the surface of the article, whereby the heated surface causes the fed stock material to melt when the fed stock material comes into contact with the surface, thereby enabling the formation of the bead as the surface temperature reduces or cools down.

In a further aspect, the invention provides a composition for cladding a surface of an article, the composition including:

a matrix material and a reinforcing material, wherein the matrix material is in a binder phase and forms approximately 10 to 95 percent by weight of the composition, and the reinforcing material is in a carbide phase and forms approximately 5 to 90 percent by weight of the composition.

BRIEF DESCRIPTION OF THE DRAWINGS

Preferred embodiments of the invention will now be described, by way of example only, with reference to the accompanying drawings in which: —

PREFERRED EMBODIMENTS OF THE INVENTION

Figure 1:
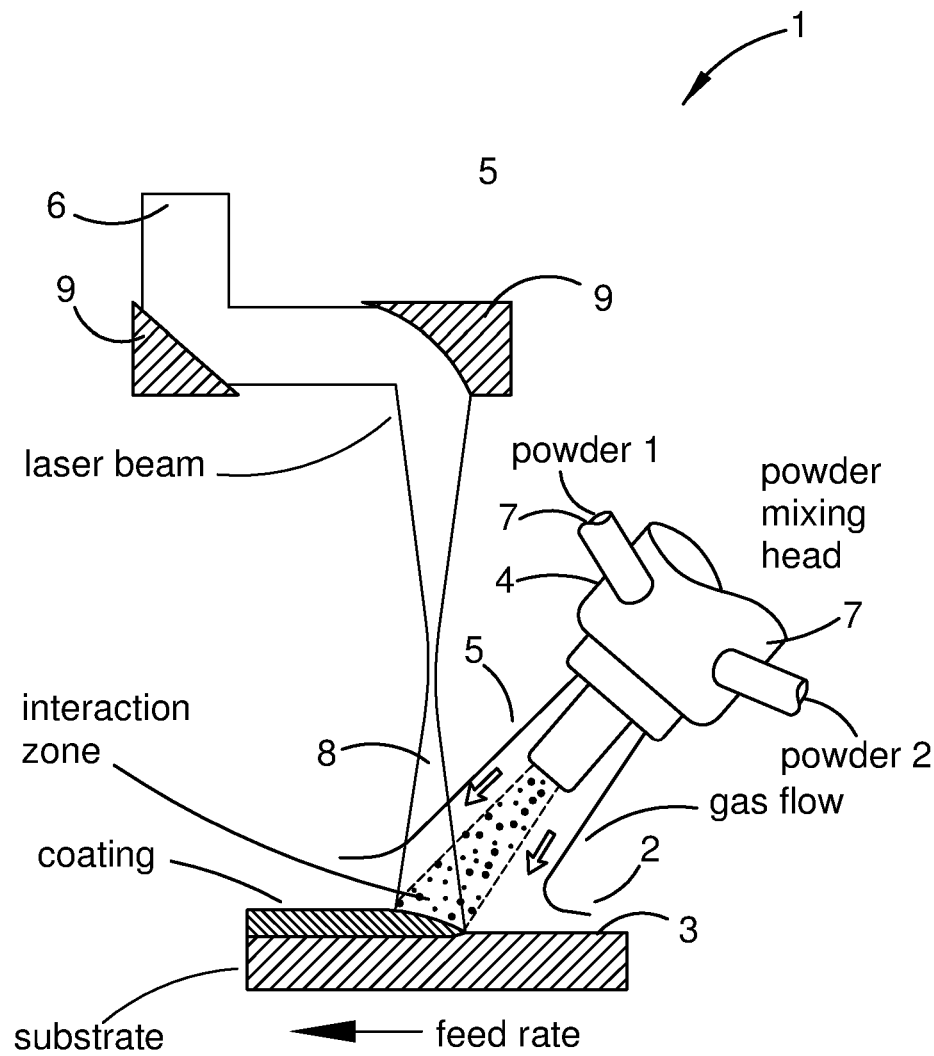
FIG. 1 is a schematic representation of a system for laser cladding an article with a coating layer in accordance with the present invention.

Referring to the drawings, the invention in a first aspect provides a method and apparatus for cladding a surface of an article. The method is particularly suited to cladding the outside surface of metallic objects such as, for example, cutting, impacting, drilling and grinding tools. Such tools can be used, for example, in portable power driven percussive tools with fluid-pressurised drive, electromotor drive or electromagnetic drive for mining or quarrying applications. The following description will be made with reference to one particular use of the cladding method for depositing a wear resistant coating layer on a down the hole ("DTH") hammer drill, as shown in FIGS. 5 to 13. It should be appreciated, however, that the cladding method is not limited to this particular application, which is provided by way of illustrative example only to highlight the benefits of the present invention.

Referring initially to FIG. 1, an apparatus or system 1 is provided for cladding an outer surface 2 of an article 3. The apparatus 1 includes a feed mechanism in the form of a feed nozzle 4 operatively connected, via suitable piping or ducting (not shown), to a supply of powered or granular feedstock material 5 held in a reservoir or container (not shown). The feed nozzle 4 is configured for feeding the stock material 5 towards a target portion of the outer surface 2 of the article 3.

The system 1 further includes a heat source in the form of a laser 6 for heating the fed stock material 5 and the target portion of the surface 2 of the article 3. The laser 6 preferably has a control mechanism such that the laser can be selectively controlled to produce a desired output power suitable for the particular material of the article 3 to be coated.

The laser 6 is set to produce the desired power output such that the heated stock material and the target portion of the surface at least partially melt, whereby, upon removal of the heat, the molten feedstock and the surface portion fuse (or otherwise cooperate or interact) to form a bonded coating layer on the surface of the article.

The article 1 is arranged so as to be movable relative to the feed and heat sources (4, 6). To achieve this relative movement, the article is releasably mounted to a workstation (not shown). For generally cylindrical articles, such as the component parts of the DTH hammer drill, the workstation comprises a rotatable mounting assembly (not shown) in which component parts can be mounted such that rotation of the mounting assembly causes a corresponding rotation of the article or component part 3. The article 3 is typically mounted to rotate about its longitudinal axis. The mounting assembly is preferably driven by a suitable drive means, such as an electric motor.

In some embodiments such as that shown in FIG. 1, the article 1 may have a generally planar or flat surface, and the workstation may be configured to enable linear motion of the workstation, thereby causing a corresponding movement of the article mounted thereto. For example, the workstation may be adapted for movement along each of the Cartesian coordinate axes (i.e. x-, y-, z-axes). However, for ease of reference, the following description will be made with reference to a rotatable mounting assembly in which the article is rotated during the cladding process.

The feed and heat sources (4, 6) are also selectively movable relative to the workstation and article 3 to provide the desired position, orientation and spacing between the respective components. In particular, the article 3, the feed nozzle 4 and the heat source 6 are all configured to move in a predetermined manner during the cladding process such that the feedstock material is deposited on the surface 2 of the article 3 so as to extend along a desired path or pattern. For cylindrical components, the feedstock material is preferably deposited on the surface of the article in a circumferentially overlapping, spirally directed path, wherein successive passes (or beads) of the feedstock material overlap the previous (or immediately adjacent) bead.

The movement of the workstation, feed nozzle 4 and laser 6 is controlled by a control mechanism in the form of a computer numerically controlled (CNC) unit. The CNC unit is adapted to enable the workstation to be rotated at a desired speed and the feed and heat sources (4, 6) to simultaneously track along the longitudinal axis of the workstation/article. The CNC unit may also be configured to control the feed rate of the feed nozzle 4, and the power output of the laser 6.

It will be appreciated that the feedstock material may be selected so as to have predetermined chemical properties to facilitate coalescing, fusing, mixing and/or bonding with the base material of the component or article to be coated. The feedstock material is preferably a powdered metallic material, advantageously adapted to form a strong metallurgically bonded wear resistant coating layer on the surface of the metallic article, following the laser cladding process.

In the illustrated embodiment, the preferred feedstock material is in the form of a metal matrix composite (MMC), having characteristics adapted to provide high abrasive and erosive wear resistance properties in the coating layer.

The composition of the MMC includes a matrix material and a reinforcing material dispersed within the matrix material. The MMC comprises approximately 5 to 90 percent by weight of matrix material (i.e. binder phase), and from 10 to 95 percent by weight of reinforcing material (i.e. carbide phase).

The matrix material is in the form of a powdered self fluxing alloy, with particles sized within the range of approximately 15 μm to 200 μm. For example, the matrix material may be selected from the group, including but not limited to, nickel, cobalt and iron, preferably containing additions of boron or silicon.

Nickel, cobalt or iron based self fluxing alloys are preferred for the matrix material, due to their lower melting temperatures and associated lower reactive influence on the carbide particles, as well as having excellent wetting characteristics with the carbide particles and the base metal.

The carbide phase reinforcing material is also a particulate material and preferably selected from the group including, but not limited to, tungsten carbide, titanium carbide, chromium carbide, niobium carbide, silicon carbide, vanadium carbide and boron carbide. The reinforcing material is preferably formed of particles having a size within the range of approximately 1 μm to 350 μm, more preferably approximately 5 μm to 200 μm.

Tungsten carbide is preferred as the hard phase particle due to its high hardness, high melting point, and low coefficient of thermal expansion. Tungsten carbide is also advantageous as it exhibits good wettability with molten metals. One drawback of tungsten carbide relates to the fact that it has a low heat of formation, making it easily dissolved by molten metals. It is therefore important that the tungsten carbide be subjected to the minimum degree of heat energy possible.

The MMC advantageously enables the simultaneous cladding of a matrix alloy and hard-phase particles, yielding a composite microstructure in which the hard-phase particles retain their integrity in a ductile matrix. In one preferred composition, the metal matrix composite (MMC) layer is formed of tungsten carbide, in a nickel based self fluxing alloy matrix, and is deposited with a laser heat source.

In the illustrated embodiment, the hard phase particles and the matrix alloy can be fed separately to the feed nozzle 4, via separate inlet pipes 7, as shown in FIG. 1. In other embodiments, the hard phase particles and the matrix alloy can be blended together to form a composition with desired weight percentages before being delivered to the feed/cladding nozzle 4 of the feed mechanism.

It has been found that, in certain preferred embodiments, feeding the hard phase particles and the matrix alloy separately can advantageously produce an MMC deposit with a substantially more even distribution of hard phase particles across the entire coating layer. This provides significant advantages in terms of improved ability to withstand abrasive and/or erosive wear conditions over existing cladding techniques. It has been observed that, in MMC coating layers, the ductile matrix material is worn away first. Once there is insufficient matrix encapsulating the hard phase particles, these particles are then subsequently worn away. In particular, it has been observed that those areas within an MMC deposited layer having an unevenly lower percentage of hard phase particles will have a higher rate of wear compared to those areas having a relatively higher percentage or concentration of hard phase particles. Thus, the preferred embodiments of the present invention enabling laser clad wear resistance coating layers to be formed with a substantially more even distribution of hard phase particles across the entire coating surface provide a significant advantage to the functionality of the coating layer described herein.

In an effort to provide a more even distribution of hard phase particles within a laser clad MMC layer, the heat source (laser), in combination with the feed source, is adapted to provide a substantially continuous, steady, even flow of stock material to the melt pool. The CNC unit, or independent control and/or sensing means, is provided to continuously monitor and, if necessary, adjust the input parameters to either or both of the heat and feed sources such that the desired continuous, steady, even flow of stock material is achieved and maintained over the coating cycle.

Further advantages arising from the process parameters and MMC composition described herein include the ability to produce MMC layers, deposited via laser cladding, with beneficial properties, including but not limited to: reduction of total laser heat input, smaller mean carbide particle sizes, higher percentage of entrained carbide, lower decarburisation, and dissolution of the carbide, lower dilution with base material, and smaller heat affected zones.

In one preferred embodiment, the MMC layer may contain, for example, 68 w % WC, and 32 w % NiBSi alloy. It has been observed in trials that an MMC having these exemplary properties, when used in combination with predetermined laser cladding parameters, produces coating layers having dramatically improved properties and characteristics in terms of wear performance.

Referring to FIG. 1, the feed nozzle 4 is arranged upstream of the laser 6 and is adapted to feed the feedstock material 5 along an axis or plane which is inclined relative to the surface of the article (e.g. the feed nozzle feeds the stock material along an axis within the range of 0 to 90 degrees, relative to the surface of the article). The feed nozzle can be adapted to feed the feedstock material in front of the laser beam as represented whereby the powder feedstock material travels through the laser beam, or in other preferred embodiments can be adapted behind the laser beam. It has been observed that with the deposition MMC layers it is beneficial that the feed nozzle be positioned behind the laser beam and the powder material is fed directly into the molten pool generated by the laser beam and does not pass through the laser beam.

The laser 6 is adapted to emit a laser beam 8, via an optical focusing mechanism, in a direction substantially orthogonal to the surface of the article. The optical focusing mechanism is in the form of a set of lenses 9 and is operatively associated with the laser for directing and focusing the laser beam onto the desired target area or portion of the surface 2 of the article 3. For example, the laser may have a minimum beam spot diameter in the range of approximately 2 mm to 20 mm.

The laser 6 is preferably selected from the group, including but not limited to, $CO_2$ lasers, Nd:YAG lasers, $Nd:YVO_4$ lasers, diode pumped with Nd:YAG lasers, diode lasers, disc lasers, and fibre lasers.

As foreshadowed, the laser 6 has control or adjustment means for selectively adjusting, controlling and setting the power output of the laser. The laser preferably has a power output within the range of approximately 3 kW to 20 kW. It will of course be appreciated by those skilled in the art that the invention is not limited to applications with a laser operating within the specified power range, but rather may be selected so as to have the necessary power requirements for the intended cladding application.

However, it has been observed that the present invention does provide particular advantages in terms of enabling the use of lower laser power output relative to total layer material flow. For example, the present cladding method advantageously enables a faster laser clad deposition rate for a layer of a predetermined thickness at a given laser power (higher material flow rates, and faster laser scanning speed).

The laser 6 melts the surface 2 of the article 3 to a predetermined depth, thereby forming a molten bonding zone on the surface of the article. The feedstock material 5 is simultaneously melted. The predetermined chemical properties of the MMC are selected such that the molten feedstock and substrate metal in the bonding zone coalesce within the melt pool, to form a metallurgically bonded wear resistant layer on the surface of the metal base or substrate.

The ability to control the depth to which the surface of the article melts, as described, reduces the dilution of the feedstock with the substrate metal within the molten bonding zone, thereby substantially maintaining the initial and intended material properties of the feedstock upon formation of the wear resistant coating layer. The material properties of the feedstock include, for example, its composition and hardness. In this context, geometric dilution is defined as the ratio of the clad depth in the substrate to the total clad height. It is possible to achieve dilution rates of less than 5% with the laser cladding process described herein, subject to suitably accurate control of the laser parameters within a narrow processing range. However, dilution rates within a range of approximately 5% and 10% are more typical and readily obtainable.

As is described in further detail below, the use of a lower specific heat energy arises through the use of relatively higher heat source travel speeds. In particular, it is the increased scanning speed, which necessitates the requirement of multiple passes (reduced pitch/increased overlap) to achieve the desired thickness, that advantageously enables the size of the melt pool to be reduced. The increased scanning speed also lowers the conductive losses in the base material, thereby enabling the lower power required for a given material feed rate. Consequently, and advantageously, this enables the use of an increased material feed rate and heat source scanning speed for the same laser power.

Figure 4:
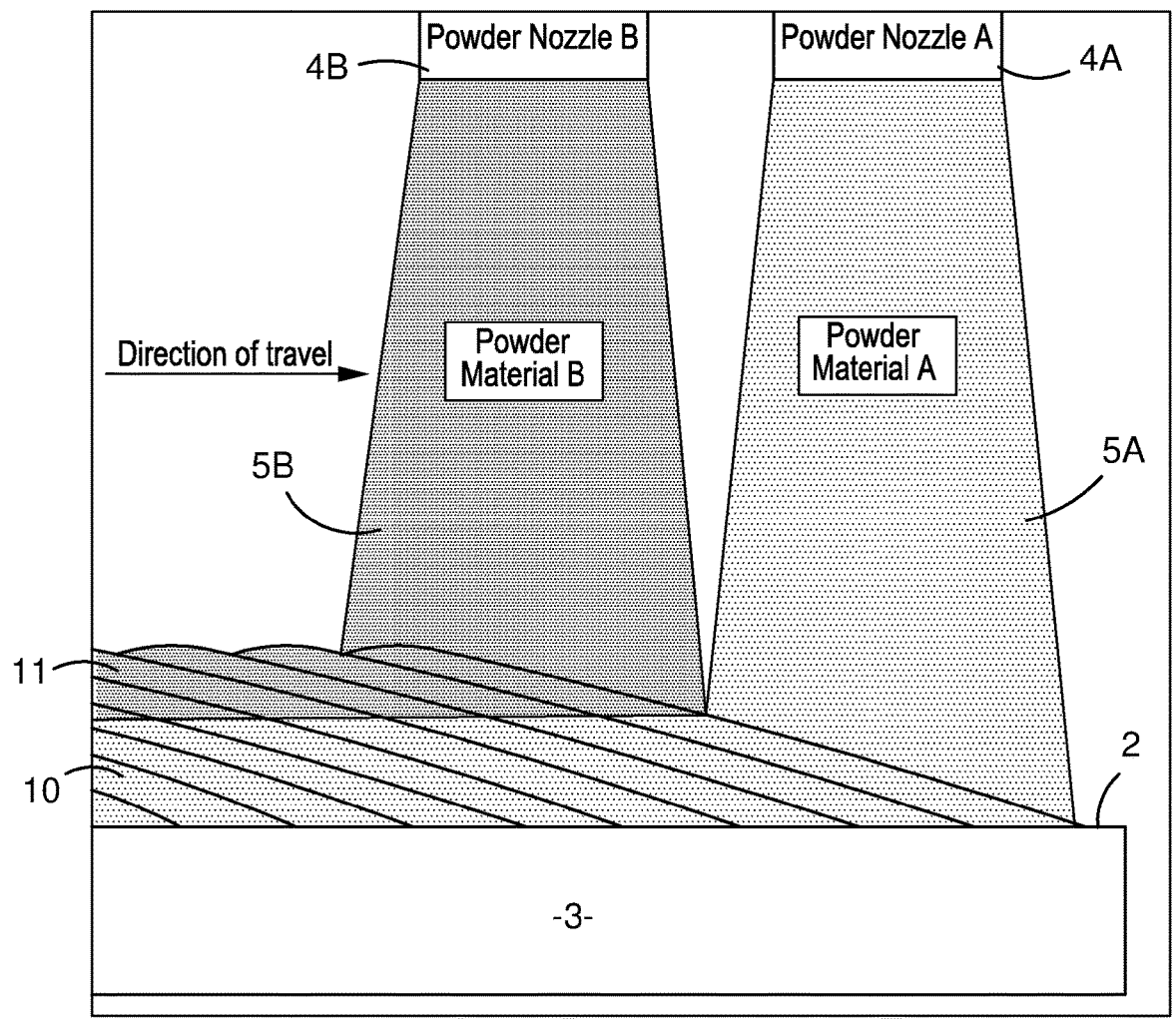
FIG. 4 is a schematic representation of a functionally graded laser deposition layer, having a bead overlap of approximately 85%.

Referring to FIG. 4, the feed mechanism 4 of this embodiment is adapted to enable the deposition of functionally graded layers in a single pass or step across the surface of the article. The feed mechanism has two feed nozzles (4A, 4B) for depositing a double graded coating layer in a single pass.

The feed mechanism 4 of FIG. 4 comprises a first feed nozzle 4A adapted to deposit a first feedstock material 5A, and a second feed nozzle 4B adapted to deposit a second feedstock material 5B. The first nozzle 4A is adapted to deposit the first feedstock material 5A directly onto the surface 2 of the article 1 to form a primary sub-layer 10 of the coating, while the second nozzle 4B is adapted to deposit the second feedstock material 5B onto the first sub-layer to form a secondary sub-layer 11 of the coating.

By incorporating more than one feed nozzle and delivering different feedstock materials to the melt pool, via the respective nozzles, the deposited coating structures can be advantageously tailored to suit the requirements of particular applications (e.g. desired wear resistance properties). The thickness of each of the sub-layers of the coating may be controlled by the respective feed rate of the associated nozzle, and may be the same thickness as each other, or vary with respect to the thickness of the other sub-layer. Furthermore, it will be appreciated that the ability to deposit functionally graded layers in a single pass advantageously eliminates the requirement for a second pass, giving rise to improvements in efficiency of the process as a whole, with associated labour, time and cost savings.

Figure 2:
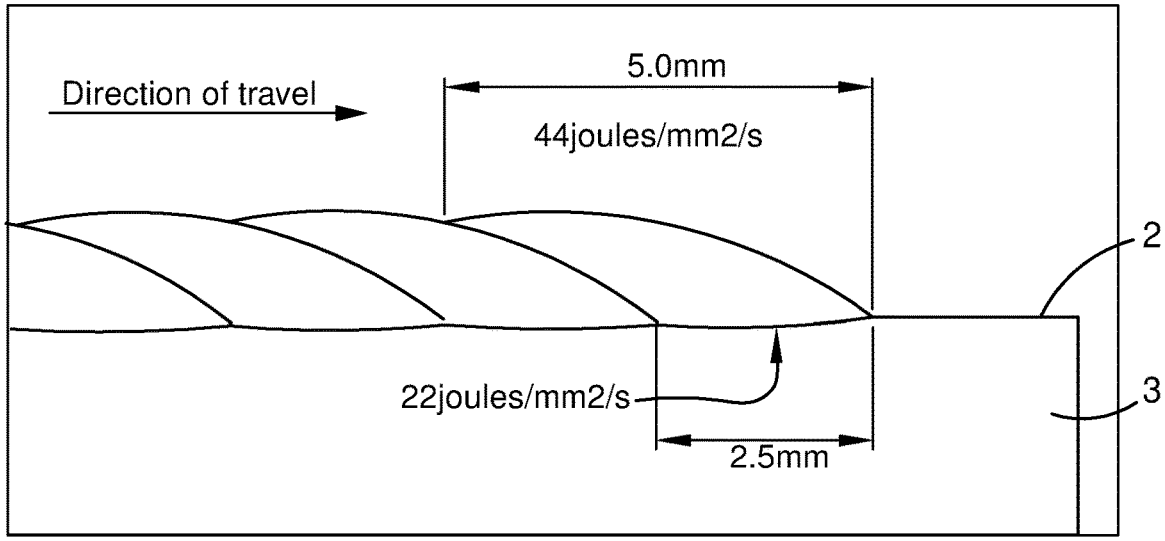
FIG. 2 is a schematic representation of laser clad layer, having a bead overlap of approximately 50%.
Figure 3:
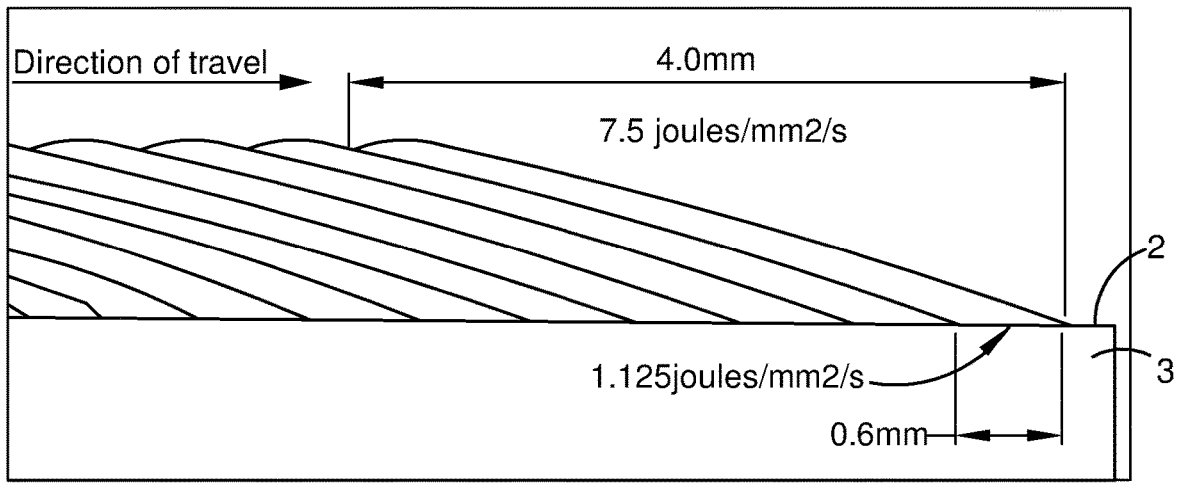
FIG. 3 is a schematic representation of a laser clad layer, having a bead overlap of approximately 85%.

Referring to FIGS. 2 to 4, to achieve area coverage of the coating layer across a desired area of the surface 2 of the article 3, the deposited beads are overlapped with the previously deposited bead. The deposited beads may be overlapped to an extent within the range of approximately 40% to 60% of the bead width, with the desired thickness/height of the layer achieved with each bead. It has been found that a decreased pitch/increased bead overlap within the range of 75% to 95%, when coupled with an increased laser heat source travel speed within the range of 4,000 mm/min to 40,000 mm/min, provides particular advantages in terms of improvements to cladding properties (including improved wear resistance) of the coating layer.

For functionally graded laser deposition layers, as shown in FIG. 4, the coating may have a bead overlap greater than 50%. In FIG. 4, the functionally graded laser deposition layer has a bead overlap of approximately 85%.

The heat source (laser) 6 is configured such that a bead or track of coating is deposited or applied to the surface at a predetermined travel speed, being the speed at which the laser (and thus melt pool) travels with respect to the surface 2 of the article 3; that is, the speed of movement of the laser 6 along or over the surface of the article. For example, with a laser power output in the range of 4 kW to 10 kW, travel speeds may typically be set to within the range of 500 mm/min to 2,000 mm/min. Surprisingly and advantageously, however, it has been found that improved cladding properties (including improved wear resistance) can be achieved by increasing the travel speed of the laser. It has been found that an increased travel speed within the range of 4,000 mm/min to 40,000 mm/min, whilst simultaneously decreasing pitch/increasing bead overlap (e.g. to within the range of 75% to 95%), provides particular advantages in terms of improvements to cladding properties (including improved wear resistance) of the coating layer. The higher travel speeds of the laser described herein are beneficial in producing a coating layer with substantially greater even distribution of hard phase particles with the coating layer, substantially lower dilution with the base material and smaller heat effected zones.

Referring to FIGS. 5 to 13, an embodiment of a pneumatically actuated down the hole ("DTH") hammer drill 12 is shown. The DTH drill 12 has particular wear-prone components and regions which have been treated with the wear resistant coatings, based on formulations and techniques as described herein.

Figure 13:
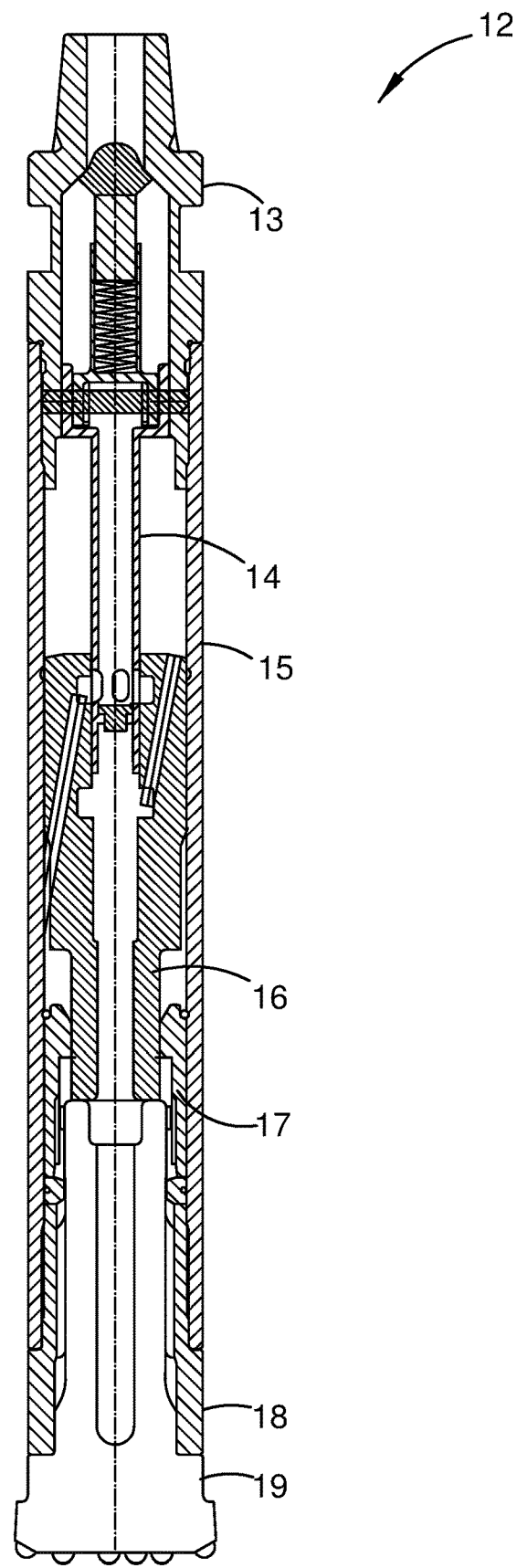
FIG. 13 is a sectional side view of another embodiment of a DTH hammer drill, showing the top sub, control tube, casing, piston, guide bush, front chuck, and drill bit.

The coating is selectively applied to the DTH drill 12 at discrete positions along the length of the drill. Referring to FIG. 13, the DTH drill 12 has a top sub 13, a control tube 14, a casing 15, a piston 16, a guide bush 17, a front chuck 18, and a drill bit 19.

Figure 5:
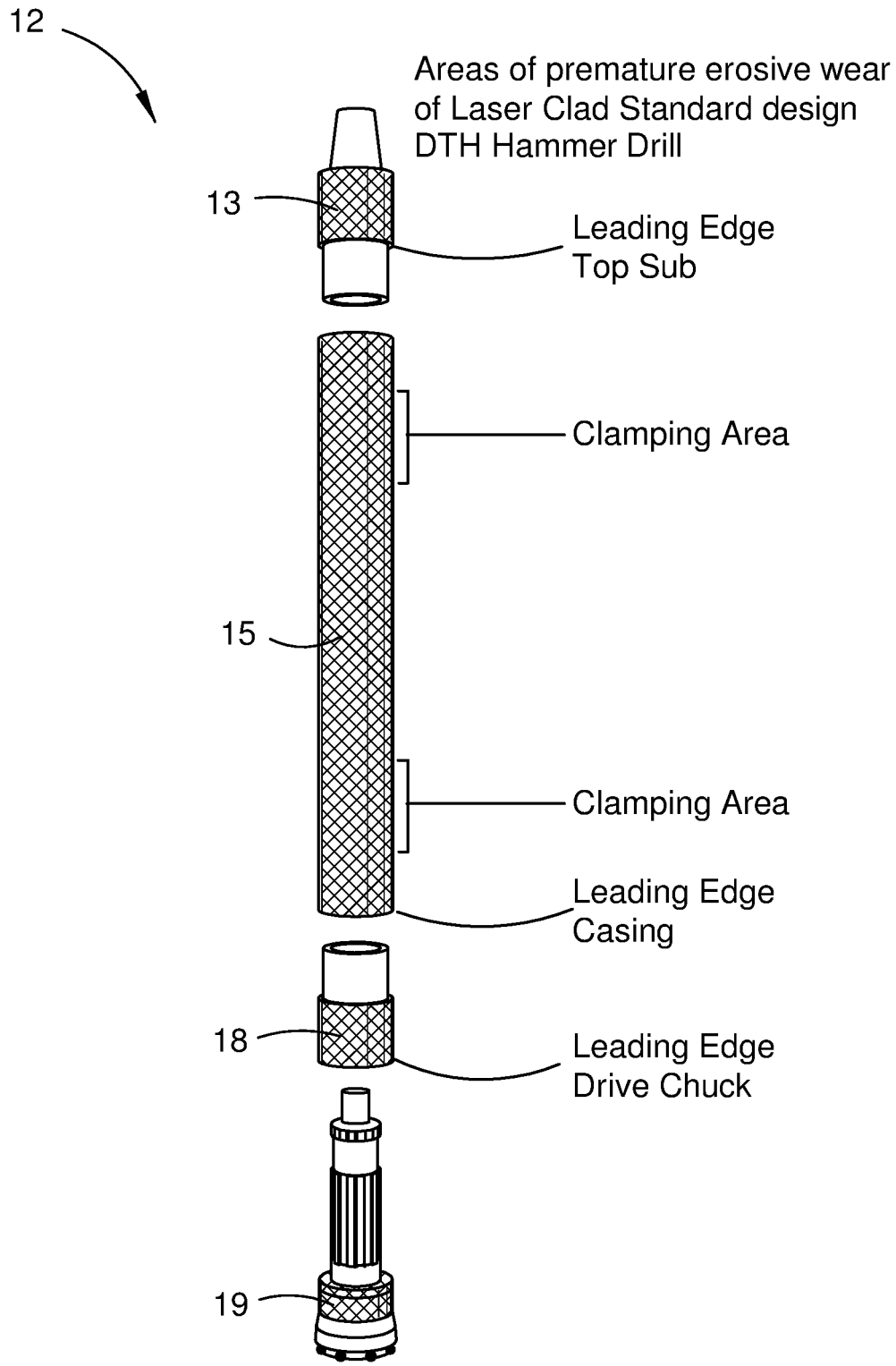
FIG. 5 is an exploded diagrammatic perspective view of a DTH hammer drill, having a laser cladding layer with properties, and applied, according to the present invention.
Figure 6:
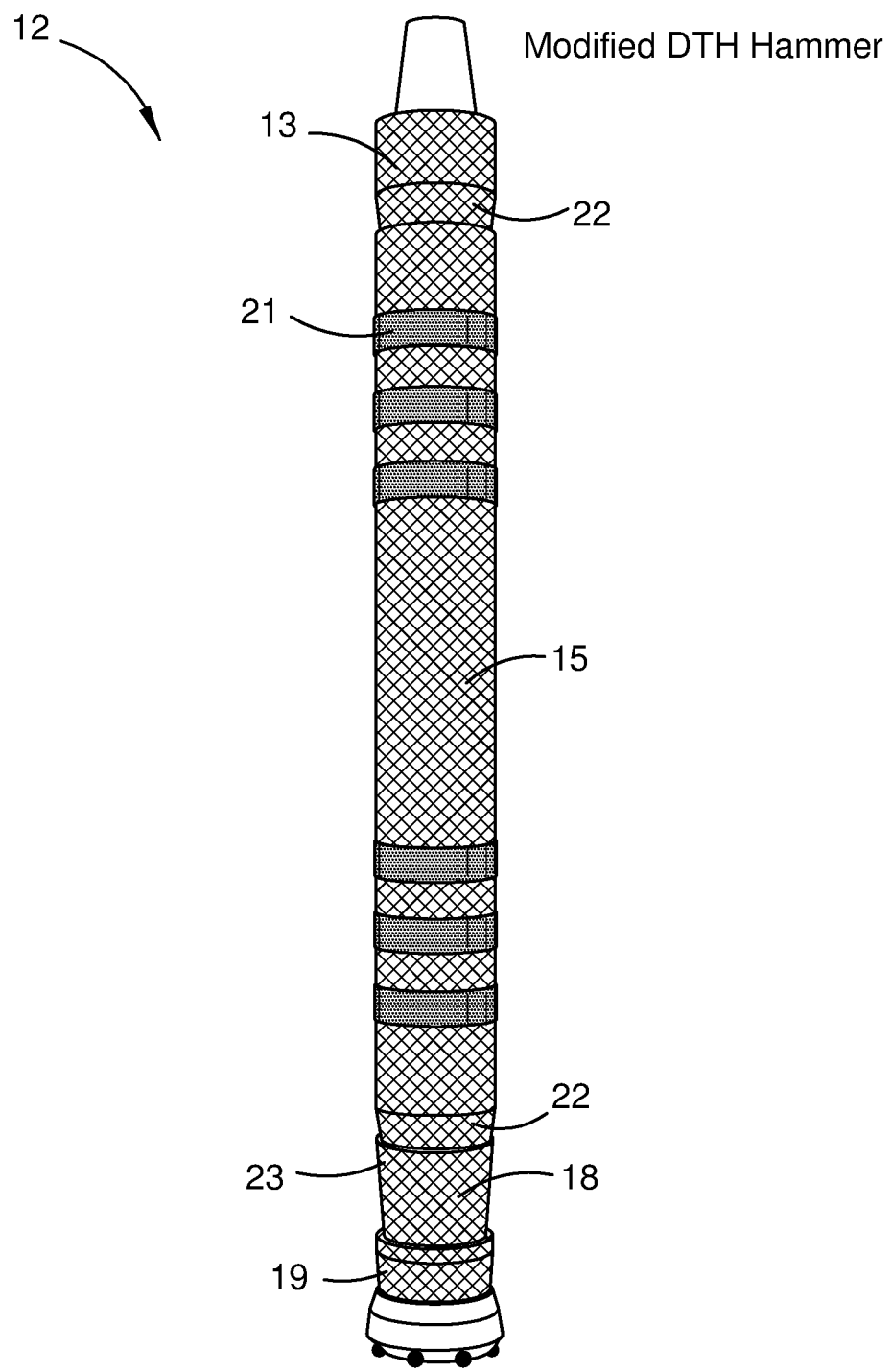
FIG. 6 shows an assembled diagrammatic perspective view of an embodiment of a modified DTH hammer drill according to the present invention.

In FIGS. 5 and 6, the DTH drill has the wear resistant coating applied to predetermined regions of the top sub 13, the casing 15, the front chuck 18, and the drill bit 19.

In the embodiment of FIG. 5, the coating is applied substantially uniformly to each of those parts, zones, positions or regions of the DTH drill to which the coating is applied.

By contrast, in the embodiment of FIG. 6, the coating is applied to the same parts as is done in the embodiment of FIG. 5, but the coating in certain areas has a greater thickness relative to the thickness of the coating applied on other parts of the drill. For example, the thickness of the coating at a particular position, or on a particular part of the drill, may be determined based upon the extent of erosive or abrasive movement or conditions to which that part of the drill is expected to be subjected during its working life. That is, a greater coating thickness may be employed on those areas of the drill which are expected to be subjected to harsher working conditions.

In FIG. 6, the casing 15 of the DTH drill 12 has two zones 20 in which an auxiliary coating 21, for enhancing the wear resistance of the casing in those zones, is deposited. In the embodiment of FIG. 6, the two zones 20 of auxiliary coating 21 are positioned so as to correspond with a clamp (not shown) of an associated drilling machine (not shown) in which the DTH drill 12 is clamped, in use. Thus, the auxiliary coatings 21 enhance the ability of the casing 15 to withstand wear arising from sliding contact and/or twisting movement of the casing against the jaws of the clamp.

Each zone 20 of auxiliary coating 21 comprises three bands of coating. Each band is configured to extend in an uninterrupted manner, circumferentially around the casing. In the illustrated embodiment, the bands are of equal width and evenly spaced apart by a predetermined distance (e.g. the band width may be equal to the width of the spacing between bands).

A first zone of the auxiliary coating is arranged at or adjacent an operatively upper end of the casing such that the first zone is positioned to be substantially in line with the location of the jaws of an upper clamp of the drilling machine. A second zone of the auxiliary coating is arranged at or adjacent an operatively lower end of the casing such that the second zone is positioned to be substantially in line with the location of the jaws of the lower clamp of the drilling machine.

It has been found that the longevity of the MMC wear resistant coating on the leading edges of the parts of the DTH hammer drill assembly can be significantly improved by making the respective parts such that a leading edge of each part of the assembly has a smaller diameter, relative to the size of the mating surface of the immediately adjacent part in the assembly.

Figure 7:
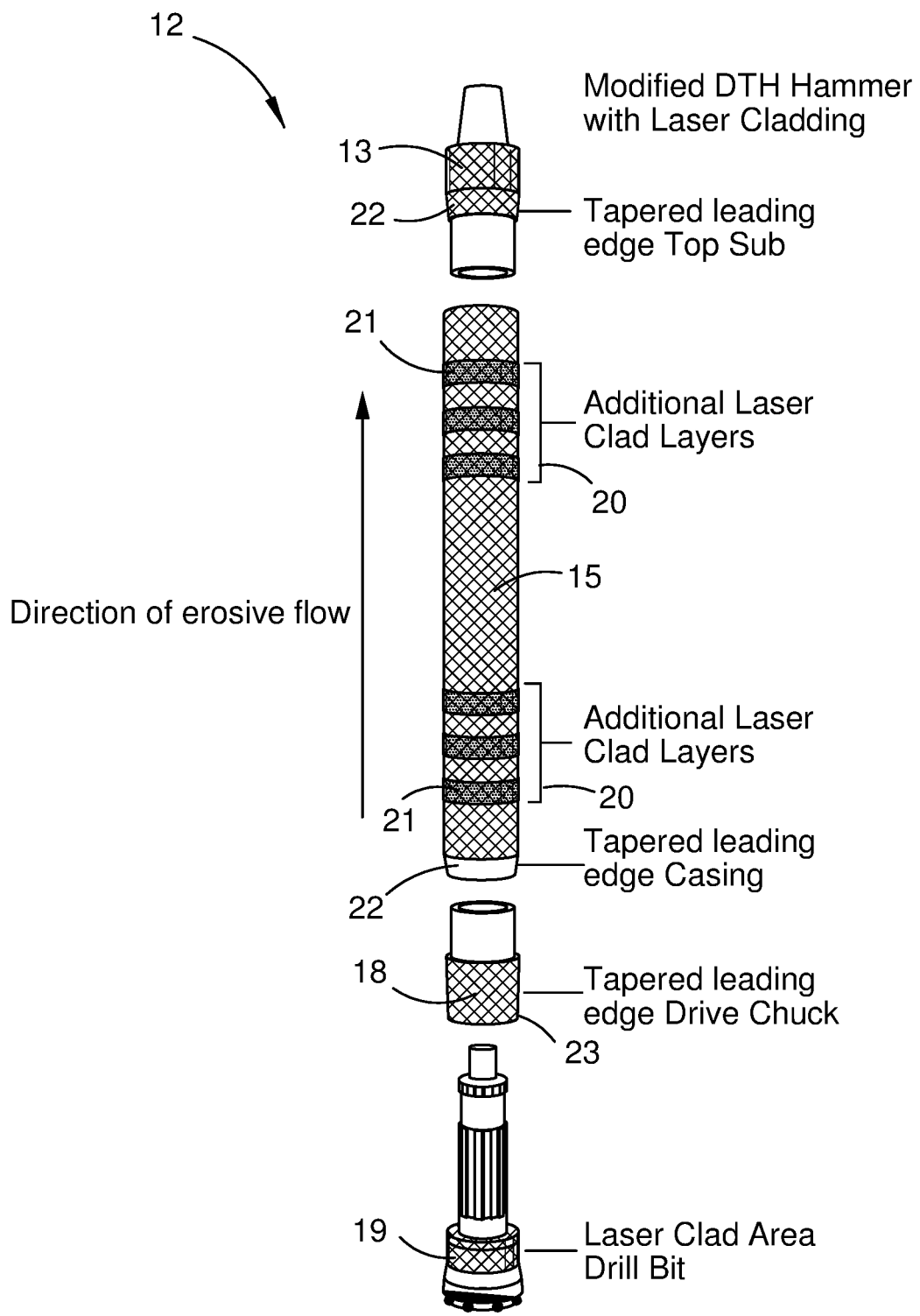
FIG. 7 is an exploded diagrammatic perspective view of the DTH hammer drill of FIG. 6.
Figure 8:
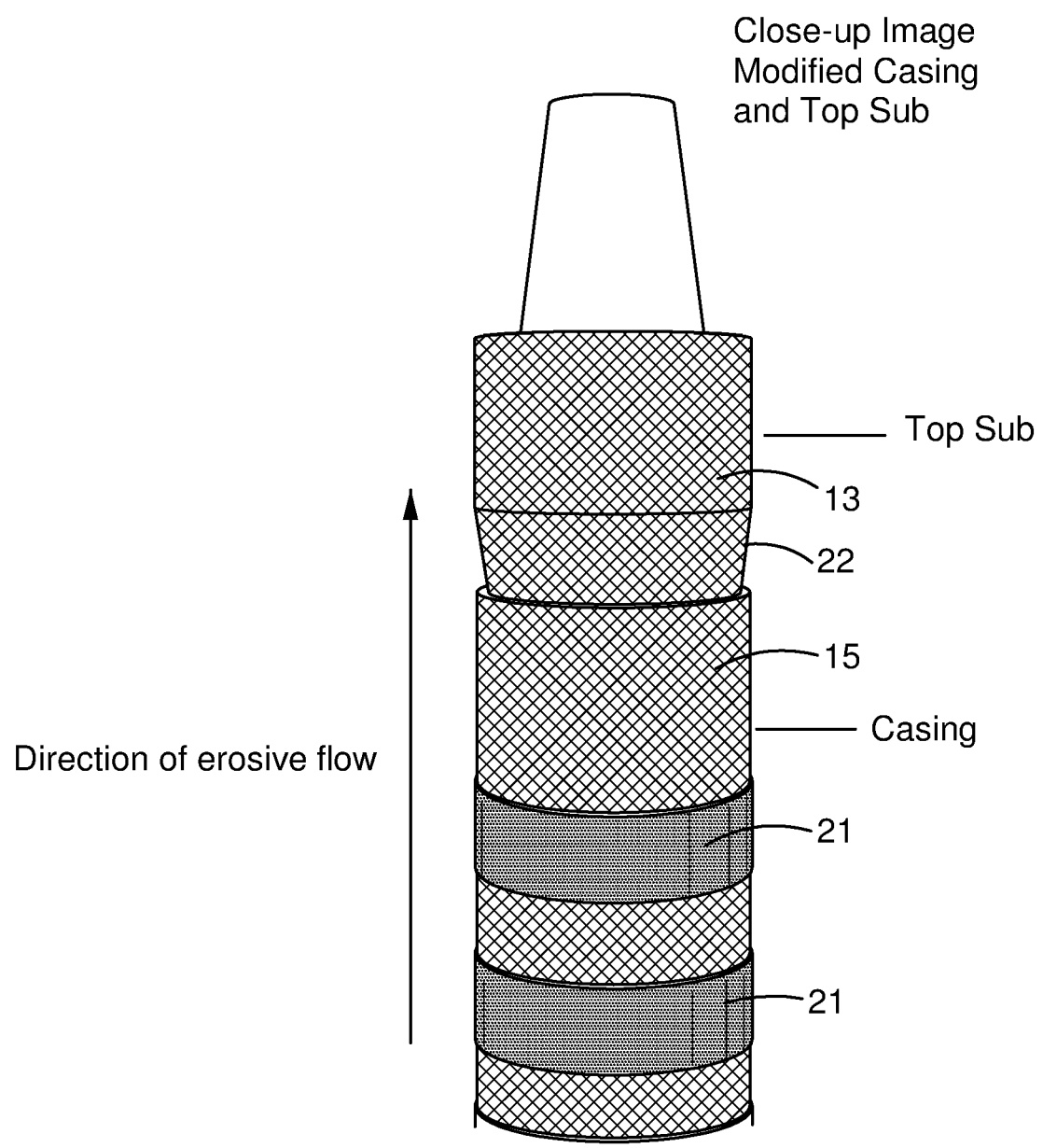
FIG. 8 is an enlarged diagrammatic partial view of the DTH hammer drill of FIG. 6, showing the assembly of the casing and top sub of the drill.
Figure 9:
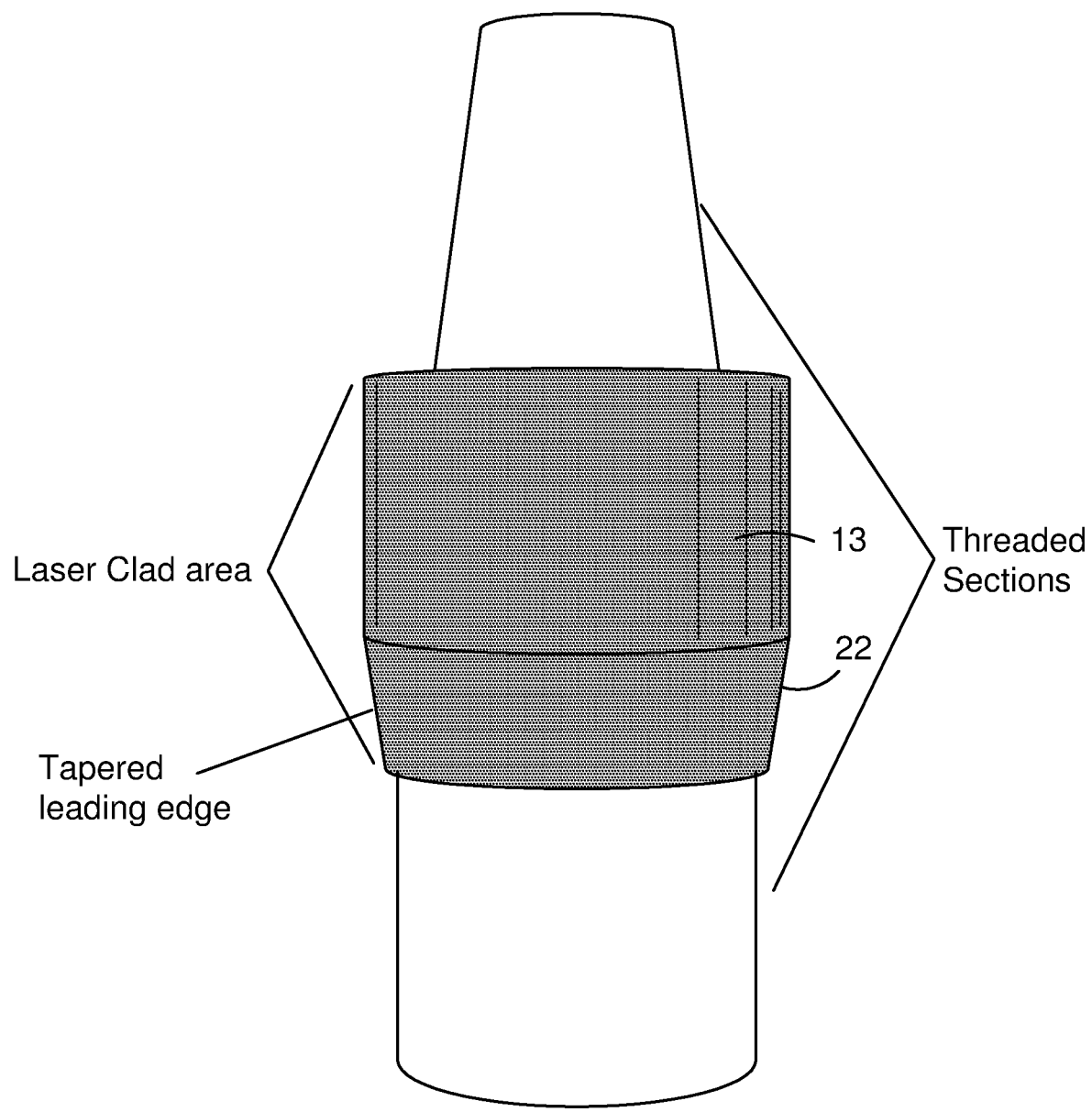
FIG. 9 is an enlarged diagrammatic view of the top sub of the DTH hammer drill of FIG. 6, showing the laser clad layer coated area and a bevelled leading end.
Figure 10:
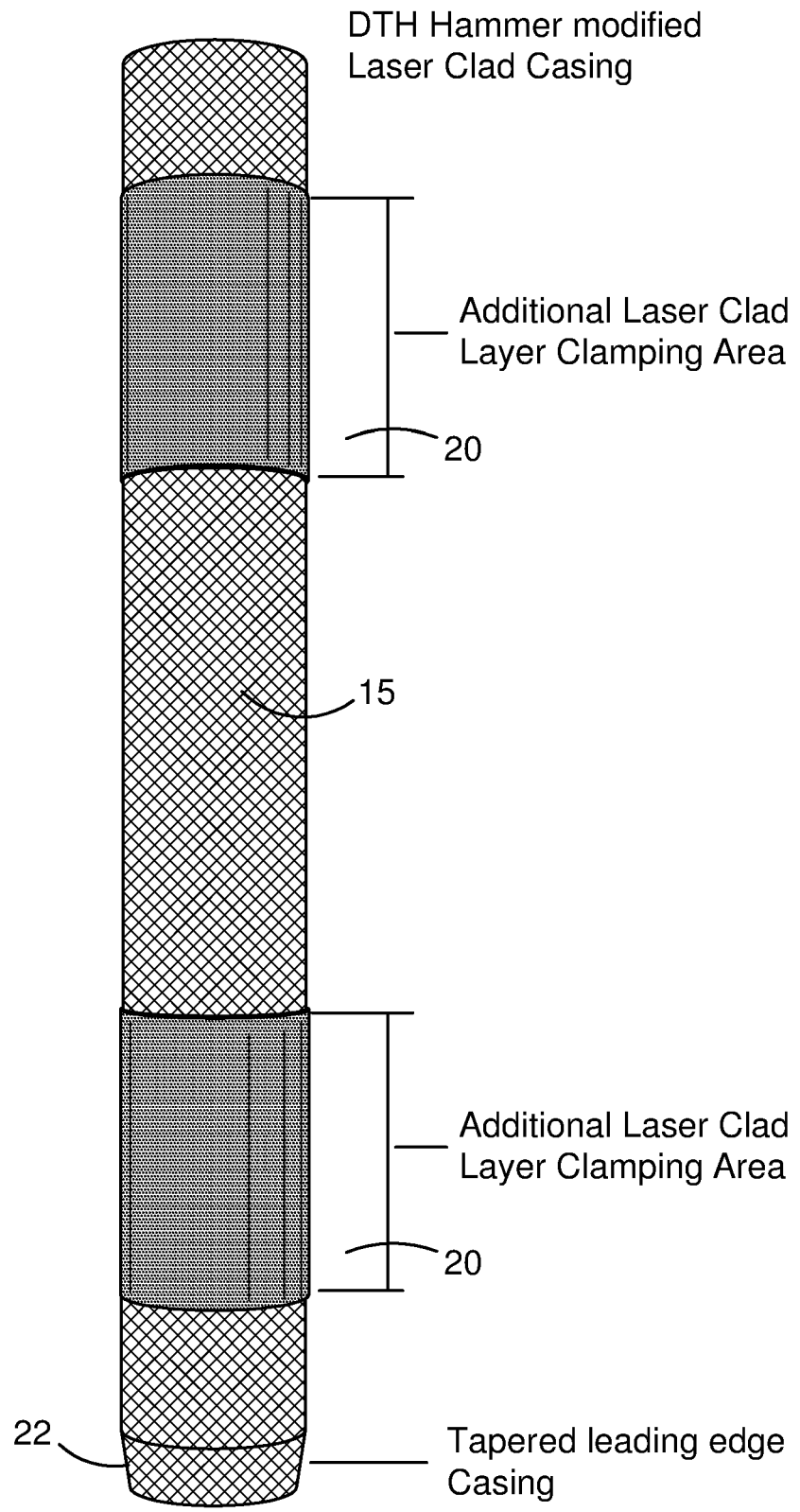
FIG. 10 is an enlarged diagrammatic partial view of the casing of the DTH hammer drill of FIG. 6, showing additional laser clad layer coated areas.
Figure 11:
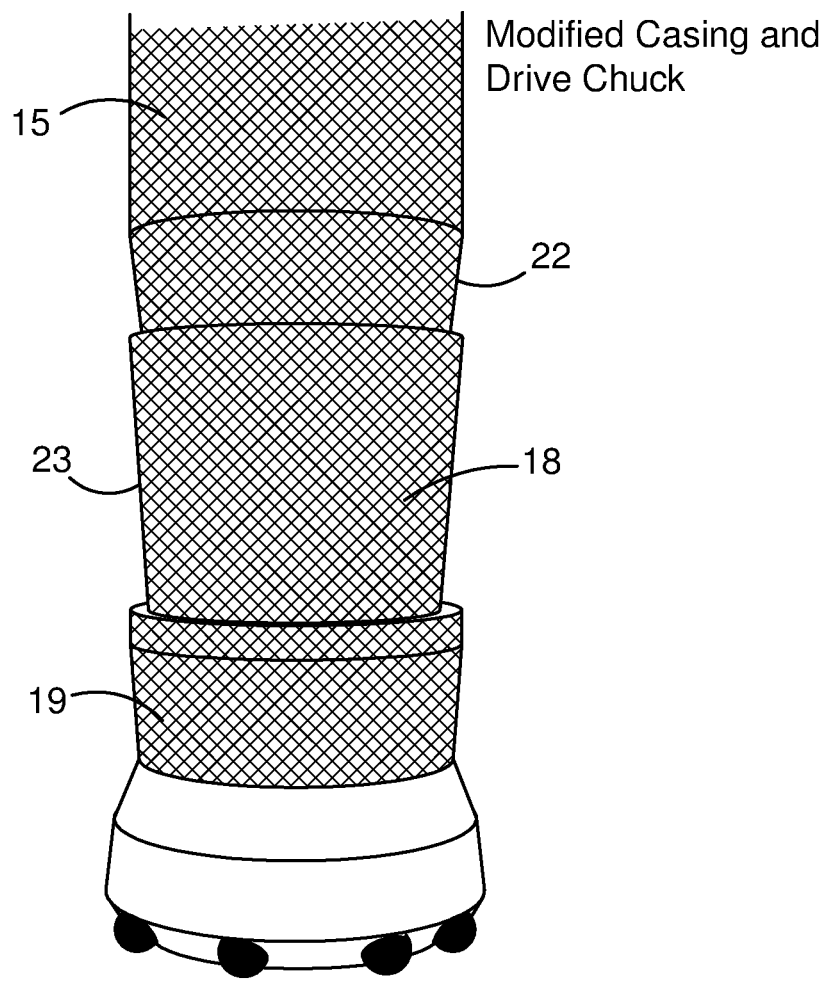
FIG. 11 is an enlarged diagrammatic partial view of the DTH hammer drill of FIG. 6, showing the assembly of the casing, the drive chuck, and the drill bit.
Figure 12:
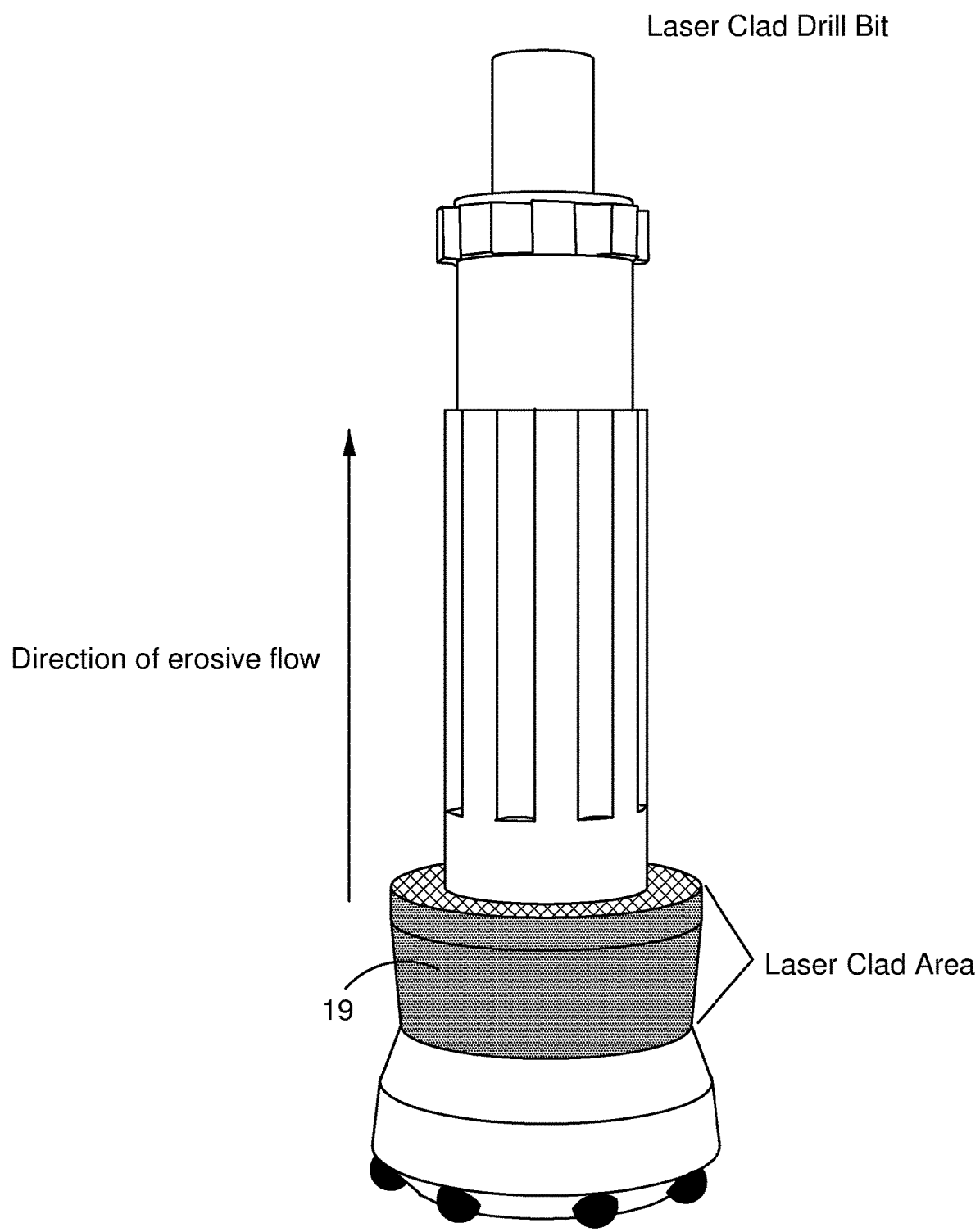
FIG. 12 is an enlarged diagrammatic partial view of the drill bit of the DTH hammer drill of FIG. 6, showing the laser clad layer coated area.

In the illustrated embodiments, as most easily seen in FIG. 7, the leading edge of the top sub 13 is bevelled to provide the difference in diameters between the mating surfaces of the top sub 13 and casing 15 (see also FIGS. 8 and 9). Similarly, the leading edge of the casing 15 is bevelled to provide the difference in diameters between the mating surfaces of the casing 15 and front chuck 18 (FIG. 10). An outer surface of the front chuck 18 is tapered to provide the difference in diameters between the mating surfaces of the front chuck 18 and drill bit 19 (FIG. 12).

By way of example, the following process parameters are provided to illustrate the potential advantages of the invention. In one exemplary embodiment of the cladding method, the movement apparatus is configured to move the surface of the article with respect to the laser beam at a travel speed of 5,000 mm/min. The heat and feed sources are configured to provide an overlap of approximately 85%. By increasing the travel speed and increasing the overlap of each bead with the previous bead, the clad height per pass and the overall melt pool size are dramatically reduced, thereby minimising the effect of small inconsistencies in powder feeding as well as reducing the effects of melt pool stirring.

Under these parameters, the mode of bonding with the base metal also changes. Instead of the laser beam directly melting and mixing the base material and powder (as is required with standard laser cladding process parameters), the laser heats the base material to a temperature that allows the boron and silicon within the matrix material, to act as fluxing and deoxidising elements so as to allow the lower melting point self fluxing alloy to wet and fuse with the base metal and produce a metallurgical bond, via an intergranular alloying/cohesion mechanism, similar to that achieved with the spray and fusing process.

In experimental trials conducted with these parameters, it was found that during deposition, it was beneficial to reduce the laser power down to 5,000 watts. For a 100 mm diameter test piece, an increased rotational speed of 15.91 rpm (up from a standard parameter setting of 4.77 rpm) reduced the heat conduction losses into the base material, giving rise to the unexpected requirement of having to reduce the laser power needed to achieve the desired melting of the previously deposited layer and heating of the base material to effect a well bonded and homogenous wear resistant layer. It was also found that a thicker layer was deposited for the same total powder feed rate of 74 gpm.

Without limiting the scope or efficacy of the invention to any particular theoretical proposition, it is hypothesised that the elongation of the melt pool, due to the increased travel speed, increases the catchment efficiency of the injected powder. On the basis of these trials, it has also been found that increasing travel speed decreases the heat conductive losses in the base metal and therefore the deposited layer retains a higher temperature as it returns to be irradiated by the laser beam for the subsequent deposit of material. Lower laser power is therefore required to achieve the desired melting. As such, the new process is vastly more efficient than existing laser cladding processes.

Metallographic examination of sections of the deposit revealed microstructures with even distribution of WC particles, no cracks, very little porosity, discernibly lower heat effects to the WC particles, and a geometric dilution that was so small as to be unmeasurable.

It is further hypothesised that higher travel speeds, increased powder feed rates, and/or a higher retained volume % of WC could be achieved.

Using a 6 kW $CO_2$ laser and maintaining the desired MMC layer thickness, the following parameters were applied:—

Laser power=5,500 watts
Laser spot diameter=4 mm
Travel speed=183.33 mm/sec-11,000 mm/min
Pitch/overlap=0.6 mm/85%
Clad height=1.2 mm
Total powder feed rate=110 gpm
Volume of retained WC=63%
183.33 mm/sec travel speed×4 mm spot size=733 $mm^2$/sec
5,500 watts laser power divided by 733 $mm^2$/sec, gives a Specific Energy=7.50 joules/$mm^2$/sec
The base metal is directly subjected to a specific laser energy of
7.50 divided by (4 mm divided by 0.6)=1.125 joules/$mm^2$/sec.
Deposit thickness per pass=180 microns Under these exemplary parameters, a deposit rate increase of 76% was obtained compared to the standard laser cladding parameters.

Metallographic examination of sections of the layer deposited using the above aforementioned parameters revealed microstructures with an even distribution of WC particles, no cracks, very little porosity, discernible lower heat effects to the WC particles, and a geometric dilution that was not measurable.

Thinner layers can easily be achieved with this method by an increase in travel speed. For example increasing the travel speed to 366.6 mm/sec-22,000 mm/min and, keeping all other parameters the same, a deposit thickness of 0.6 mm was achieved (deposit thickness per pass of 90 microns).

Factors that influence and result in the improved abrasive and erosive wear performance of the laser clad MMC layer include: the overall percentage of entrained hard particles in the deposited layer, the size and shape of the entrained hard particles, the distribution of hard particles within the deposited layer, and the chemistry and hardness of the entrained hard particles. It is therefore advantageous to laser clad an MMC layer by the manner described herein so as to provide a high percentage of entrained hard particles that are evenly distributed within the deposited layer, and that the entrained hard particles are of a chemistry, size and hardness that are suitable for the application.

Factors that influence and result in the improved overall percentage of the entrained hard particles within a laser clad MMC layer and the distribution of the entrained hard particles within the deposited layer include: the accuracy of the process by which the hard particles are mixed with the matrix material before being delivered to the melt pool, the quality and accuracy of the feed mechanism, the specific energy applied by the laser, and the nature and extent of melt pool stirring due to temperature gradients and convective flow within the melt pool.

Test results on several samples have demonstrated, via XFM scans, that exemplary embodiments of the laser clad coating with a tungsten carbide (WC) in a nickel matrix significantly reduce undesired iron migration into the clad layer compared to existing cladding techniques, regardless of the WC concentration.

It will be appreciated that the invention in its various aspects and preferred embodiments provides a number of advantages. The invention was developed in part to improve the erosion resistance of laser clad MMC deposits and, in various preferred embodiments, provides one or more of the following advantages in that context: no measurable geometric dilution with the base material; increased efficiency of deposition; lower heat effects to hard phase particles; the ability to increase retained hard phase particle percentages with no increase in porosity or cracking; the ability to deposit smaller sized hard phase particles; dramatically improved distribution of hard phase particles; smoother as deposited surface finish; reduced residual stress formation within the deposited layer; less distortion; the ability to apply thin coatings at very fast travel speeds (enabling the process to compete cost-effectively with traditional methods such as hard chrome plating for the deposition of protective layers); lower laser energy input into the base metal; smaller heat affected zones; and the ability to deposit functionally graded layers in a single step. Based on a substantially improved coating methodology, the invention also provides a DTH hammer drill with dramatically improved wear resistance characteristics.

In these and other respects, the invention represents a practical and commercially significant improvement over the prior art.

Although the invention has been described with reference to specific examples, it will be appreciated by those skilled in the art that the invention may be embodied in many other forms. It should also be understood that the various aspects and embodiments of the invention as described can be implemented either independently, or in conjunction with all viable permutations and combinations of other aspects and embodiments. All such permutations and combinations should be regarded as having been herein disclosed.

The invention claimed is:

1. A method of cladding a surface of an article, the method including the steps of:
providing a supply of feedstock material, the feedstock material being a metal matrix composite with a composition including a matrix material and a reinforcing material dispersed within the matrix material;
feeding, by a feed mechanism, the feedstock material towards a portion of the surface of the article via a dedicated feed source;
providing the feed mechanism with at least two feed nozzles for depositing a multilayer coating in a single pass across the surface of the article, wherein the feed mechanism comprises a first feed nozzle adapted to deposit a first feedstock material directly onto the surface of the article to form a first sub-layer of the coating, and a second feed nozzle adapted to deposit a second feedstock material adapted to deposit the second feedstock material onto the first sub-layer to form a secondary sub-layer of the coating, wherein the first and second feed nozzles are both in communication with a single reservoir of feedstock material, whereby the same stock material is used for both the primary and secondary sub-layers;
heating the portion of the surface of the article via a dedicated heat source such that the fed feedstock material and the portion of the surface at least partially melt, whereby, upon removal of the heat, the molten feedstock and the surface portion form a bonded coating layer deposited by way of overlapping beads on the surface of the article, wherein each deposited bead is overlapped with the previously deposited bead to an extent within the range of approximately 75% to approximately 95% of the respective bead width; and controlling the feed and heat sources to cause the beads of the bonded coating layer to be deposited at a surface speed rate of at least 500 mm/min to provide the bonded coating layer with a substantially even distribution of the reinforcing material throughout the matrix material.

2. A method according to claim 1, including the step of providing a selectively programmable control means configured for controlling movement of the feed and heat sources relative to the article, wherein the control means is configured to cause the beads of the bonded coating layer to be deposited at a surface speed rate of at least 2000 mm/min.

3. A method according to claim 2, wherein the control means is configured to cause the beads of the bonded coating layer to be deposited at a surface speed rate of at least 4000 mm/min.

4. A method according claim 1, wherein the heat source is in the form of a laser, and the method includes the step of setting a power output of the laser to be within the range of approximately 3 kW to approximately 20 kW.

5. A method of cladding a surface of an article according claim 1, wherein the matrix material is wear resistant and formed of a self fluxing alloy.

6. A method of cladding a surface of an article according claim 1, wherein the metal matrix composite comprises approximately 5 to 90 percent by weight of binder phase matrix material, and from 10 to 95 percent by weight of hard phase particulate reinforcing material.

7. A system for cladding a surface of an article, the system including:
a feed mechanism associated with a supply of feedstock material, the feedstock material being a metal matrix composite with a composition including a matrix material and a reinforcing material dispersed within the matrix material, wherein the feed mechanism is configured to feed the feedstock material towards a portion of the surface of the article, wherein the feed mechanism has at least two feed nozzles for depositing a multilayer coating layer in a single pass, wherein the feed mechanism comprises a first feed nozzle adapted to deposit a first feedstock material directly onto the surface of the article to form a first sub-layer of the coating, and a second feed nozzle adapted to deposit a second feedstock material adapted to deposit the second feedstock material onto the first sub-layer to form a secondary sub-layer of the coating, wherein the first and second feed nozzles are both in communication with a single reservoir of feedstock material, whereby the same stock material is used for both the primary and secondary sub-layers;
a heat source for heating the portion of the surface of the article such that the fed feedstock material and the portion of the surface at least partially melt, whereby, upon removal of the heat, the molten feedstock and the surface portion cooperate to form overlapping beads to define a bonded coating layer on the surface of the article, with each bead of the coating layer overlapping the previously deposited bead to an extent within the range of approximately 75% to approximately 95% of the respective bead width; and
a controller for controlling the feed mechanism and heat source to cause the beads of the bonded coating layer to be deposited at a surface speed rate of at least 500 mm/min to provide the bonded coating layer with a substantially even distribution of the reinforcing material throughout the matrix material.

8. A system according to claim 7, wherein the controller is configurable to cause the beads of the bonded coating layer to be deposited at a rate of at least 2000 m/min.

9. A system according to claim 7 wherein the controller is configurable to cause the beads of the bonded coating layer to be deposited at a rate of at least 4000 m/min.

10. A system according to claim 7, wherein the feed mechanism includes at least one feed nozzle, the at least one feed nozzle being operatively associated with a reservoir of the stock material.

11. A system according to claim 7, wherein the first feedstock material is contained in a first reservoir, the first feed nozzle being in communication with, and operatively associated with, the first reservoir such that the first feedstock material can be fed through the first feed nozzle; and wherein the second feedstock material is contained in a second reservoir or container, the second feed nozzle being in communication with, and operatively associated with, the second reservoir such that the second feedstock material can be fed through the second feed nozzle.

12. A system according to claim 7, wherein the heat source is in the form of a laser adapted to emit a laser beam, the laser being configured in use with a predetermined energy rating for simultaneously heating and melting the portion of the surface of the article and separately delivered feedstock to form a melt pool.

13. A system according to claim 7, including a workstation to which the article is releasably mountable, the feed mechanism, heat source and workstation being configured to enable relative movement therebetween to provide a desired position, orientation and spacing between the feed mechanism, heat source and article.

14. A system according to claim 13, wherein the controller is operatively associated with the workstation for controlling movement of the workstation, and thereby the relative position and/or orientation of the surface of the article with respect to the feed mechanism and heat source.

* * * * *

UNITED STATES PATENT AND TRADEMARK OFFICE
CERTIFICATE OF CORRECTION

PATENT NO. : 11,173,571 B2
APPLICATION NO. : 15/521329
DATED : November 16, 2021
INVENTOR(S) : Gregory Hooper It is certified that error appears in the above-identified patent and that said Letters Patent is hereby corrected as shown below:

In the Specification

Column 1, Line 10, please delete "2016" and insert therefor -- 2015 --;

In the Claims

Column 25, Line 22, Claim 4, after "according" please insert -- to --;

Column 25, Line 26, Claim 5, after "according" please insert -- to --;

Column 25, Line 29, Claim 6, after "according" please insert -- to --;

Column 26, Line 19, Claim 8, please delete "m/mm" and insert therefor -- mm/mm --;

Column 26, Line 22, Claim 9, please delete "m/mm" and insert therefor -- mm/mm --; and Column 26, Line 39, Claim 12, please delete "being" and insert therefor -- beam --.

Signed and Sealed this
Eleventh Day of October, 2022

Katherine Kelly Vidal
*Director of the United States Patent and Trademark Office*